(12) United States Patent
Shin et al.

(10) Patent No.: US 10,031,410 B2
(45) Date of Patent: Jul. 24, 2018

(54) METHOD FOR FABRICATING MASK BY PERFORMING OPTICAL PROXIMITY CORRECTION

(71) Applicant: Samsung Electronics Co., Ltd., Suwon-si (KR)

(72) Inventors: Hyejin Shin, Seoul (KR); Noyoung Chung, Hwaseong-si (KR)

(73) Assignee: SAMSUNG ELECTRONICS CO., LTD., Yeongton-gu, Suwon-si, Gyeonggi-do (KR)

( * ) Notice: Subject to any disclaimer, the term of this patent is extended or adjusted under 35 U.S.C. 154(b) by 92 days.

(21) Appl. No.: 15/334,508

(22) Filed: Oct. 26, 2016

(65) Prior Publication Data

US 2017/0139317 A1 May 18, 2017

(30) Foreign Application Priority Data

Nov. 12, 2015 (KR) ........................ 10-2015-0158947

(51) Int. Cl.
G03F 1/36 (2012.01)
(52) U.S. Cl.
CPC ..................................... *G03F 1/36* (2013.01)
(58) Field of Classification Search
CPC ........................................................ G03F 1/36
USPC ...................................................... 430/5, 30
See application file for complete search history.

(56) References Cited

U.S. PATENT DOCUMENTS

| | | | |
|---|---|---|---|
| 7,376,260 B2 | 5/2008 | Callan et al. |
| 7,434,199 B2 | 10/2008 | Cobb et al. |
| 8,214,770 B2 | 7/2012 | Mukherjee et al. |
| 8,510,684 B2 | 8/2013 | Jeong et al. |
| 8,560,979 B2 | 10/2013 | Wong et al. |
| 8,595,657 B2 | 11/2013 | Cha et al. |
| 8,769,474 B1 | 7/2014 | Gennari et al. |
| 8,959,471 B2 | 2/2015 | Qian |
| 2004/0058550 A1 | 3/2004 | Mono et al. |
| 2008/0076047 A1 | 3/2008 | Chun et al. |
| 2009/0110261 A1 | 4/2009 | Yang |
| 2009/0217224 A1 | 8/2009 | Wiaux et al. |
| 2010/0162197 A1 | 6/2010 | Ye et al. |

FOREIGN PATENT DOCUMENTS

| | | |
|---|---|---|
| KR | 10 0809705 B1 | 2/2008 |
| KR | 10 1033225 | 4/2011 |
| KR | 10-2015-0046657 | 4/2015 |

*Primary Examiner* — Christopher G Young
(74) *Attorney, Agent, or Firm* — Muir Patent Law, PLLC

(57) ABSTRACT

A mask fabricating method includes dividing an outline of a first design layout for a target layer into plural segments, selecting interest segments to be biased in a direction of approaching an outline of a second design layout for a lower layer of the target layer, performing optical proximity correction for the target layer based on a first cost function given to each of normal segments and a second cost function given to each of the interest segments, and fabricating the mask corresponding to the first design layout updated based on a result of the optical proximity correction. The second cost function includes a model of a margin between each of the interest segments and the outline of the second design layout. Performing the optical proximity correction includes biasing each of the interest segments up to a boundary defined by the margin.

20 Claims, 16 Drawing Sheets

METHOD FOR FABRICATING MASK BY PERFORMING OPTICAL PROXIMITY CORRECTION

CROSS-REFERENCE TO RELATED APPLICATIONS

This U.S. non-provisional patent application claims the benefit of priority under 35 U.S.C. § 119 to Korean Patent Application No. 10-2015-0158947, filed on Nov. 12, 2015, in the Korean Intellectual Property Office, the entire contents of which are incorporated herein by reference.

TECHNICAL FIELD

The present disclosure relates to semiconductor processes, and more particularly, relates to a method for fabricating a mask including image patterns used to print a layout on a wafer.

DESCRIPTION OF THE RELATED ART

In recent years, various types of electronic devices have been used. An electronic device performs a specific function according to operations of various types of chips or circuits included therein. The chips or circuits of the electronic device may be implemented with semiconductor elements fabricated by means of semiconductor processes.

A chip or a circuit implemented with semiconductor elements is obtained by means of a photolithography process. The photolithography process is used to print a layout on a semiconductor wafer (e.g., a silicon or GaAs wafer). The layout on the wafer includes circuit patterns. These circuit patterns are designed to perform their specific functions.

In the photolithography process, a mask is used to print a layout on a wafer. The mask includes a transparent region and an opaque region. The transparent region is formed by etching a metal layer on the mask. Light passes through the transparent region, whereas light does not pass through the opaque region. Image patterns used to print a layout on the wafer are formed in the transparent region and the opaque region. Light emitted by a light source is projected to a wafer through image patterns (i.e., transparent regions) of the mask. Thus, a layout including circuit patterns are printed on the wafer.

As integration density in semiconductor processes continues to increase, a distance between image patterns becomes very close and a width of transparent regions has been reduced significantly. Due to such "proximity", optical interference and optical diffraction occur, and a distorted layout different from a desired layout may be printed on a wafer. When the distorted layout is printed on the wafer, a designed circuit may operate abnormally.

SUMMARY

In some example embodiments, the disclosure is directed to a method for fabricating a mask, the method comprising: dividing an outline of a first design layout into a plurality of segments, the first design layout being associated with a target layer of optical proximity correction; selecting one or more first segments from among the plurality of segments, the one or more first segments being biased in a direction relative to an outline of a second design layout, the second layout being associated with a lower layer that is below the target layer; performing the optical proximity correction for the target layer based on a first cost function and a second cost function, the first cost function being applied to one or more second segments among the plurality of segments, the second cost function being applied to the one or more first segments; updating the first design layout based on a result of the optical proximity correction; and fabricating the mask corresponding to the updated first design layout, wherein the second cost function includes a model associated with a corresponding margin between each of the interest segments and the outline of the second design layout, and wherein performing the optical proximity correction comprises biasing each of the first segments up to a corresponding boundary defined by the corresponding margin.

In some example embodiments, the disclosure is directed to a method for fabricating a mask, the method comprising: performing first optical proximity correction for a first metal layer; performing second optical proximity correction for a second metal layer provided on the first metal layer; performing third optical proximity correction for a via layer that connects the first metal layer with the second metal layer, the third optical proximity correction including: obtaining a neighboring layout from a first design layout associated with the first metal layer, wherein the neighboring layout does not overlap a second design layout associated with the via layer and being within a reference distance from an outline of the second design layout, selecting one or more first segments from among a plurality of segments that are defined by dividing the outline of the second design layout, the first segments being to be biased in a direction of an outline of the neighboring layout, and performing the third optical proximity correction based on a first cost function applied to each of one or more second segments and a second cost function applied to each of the one or more first segments, wherein the second cost function includes a model associated with a corresponding margin between each of the one or more first segments and the outline of the neighboring layout; and fabricating the mask based on results of the first optical proximity correction, the second optical proximity correction, and the third optical proximity correction.

In some example embodiments, the disclosure is directed to a method for fabricating a mask, the method comprising: defining a plurality of segments of an outline of a first design layout, wherein the first design layout is associated with a target layer of optical proximity correction; selecting, from among the plurality of segments, one or more first segments for biasing in a direction relative to an outline of a second design layout; performing the optical proximity correction for the target layer based on a first cost function applied to one or more second segments among the plurality of segments and a second cost function applied to the one or more first segments by biasing each of the interest segments up to a corresponding boundary defined by a corresponding margin between each of the first segments and the outline of the second design layout, wherein the second cost function includes a model associated with the corresponding margin; updating the first design layout based on a result of the optical proximity correction; and fabricating the mask corresponding to the updated first design layout.

BRIEF DESCRIPTION OF THE DRAWINGS

The forgoing and other objects, features, and advantages of the present disclosure will be described below in more detail with reference to the accompanying drawings of non-limiting embodiments in which like reference characters may refer to like parts throughout the different drawings.

The drawings are not necessarily to scale, emphasis instead being placed upon illustrating principles of the present disclosure. In the drawings.

DETAILED DESCRIPTION OF EMBODIMENTS

Figure 1:
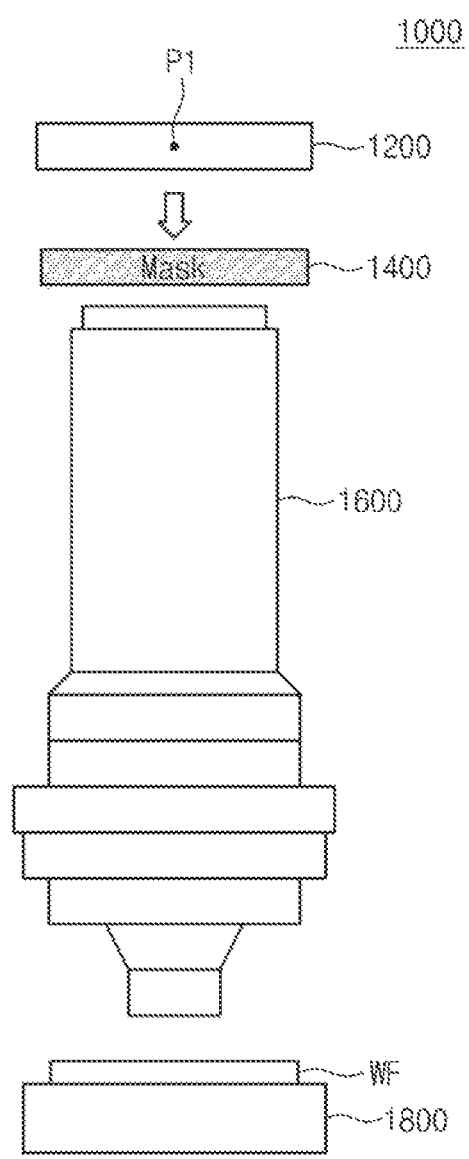
FIG. 1 is a conceptual diagram illustrating a photolithography system using a mask that is fabricated according to the example embodiments.

Exemplary embodiments are described herein with reference to cross-sectional views and/or plan views that are idealized exemplary views. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). The term "contact" as used herein refers to a direct connection (e.g., touching), unless the context clearly indicates otherwise.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal,"

or "substantially planar," may be exactly the same, equal, or planar, or may be the same, equal, or planar within acceptable variations that may occur, for example, due to manufacturing processes.

FIG. 1 is a conceptual diagram illustrating a photolithography system 1000 using a mask 1400 that is fabricated according to the example embodiments. The photolithography system 1000 may include a light source 1200, a mask 1400, a reduction projection device 1600, and a wafer stage 1800. The photolithography system 1000 may further include components that are not illustrated in FIG. 1. For example, the photolithography system 1000 may further include a sensor used to measure height and slope of a surface of a wafer WF.

The light source 1200 may emit light. The light emitted from the light source 1200 may be projected to the mask 1400. Although not shown in FIG. 1, a lens may be provided between the light source 1200 and the mask 1400 to adjust a light focus. The light source 1200 may include an ultraviolet light source (e.g., a KrF light source having wavelength of 234 nm, an ArF light source having wavelength of 193 nm, etc.). In some embodiments, the light source 1200 may include a single point light source P1. However, the present disclosure is not limited to these examples. In some embodiments, for example, the light source 1200 may include a plurality of point light sources.

The mask 1400 may include image patterns used to print a layout on the wafer WF. The image patterns may be formed to include one or more transparent regions and one or more opaque regions. The transparent regions may be formed by etching a metal layer on the mask 1400. The light emitted from the light source 1200 may pass through the transparent regions, while the emitted light may not pass through the opaque regions and may be blocked out by the opaque regions.

The mask 1400 may be fabricated by a mask fabrication method according to the example embodiments. The example embodiments will be described more fully with reference to FIGS. 2 to 22.

The reduction projection device 1600 may receive light passing through the transparent regions of the mask 1400. The reduction projection device 1600 may match circuit patterns of a layout to be printed on the wafer WF with the image patterns of the mask 1400. The wafer stage 1800 may support the wafer WF. For example, the wafer stage 1800 may be a physical structure that holds the wafer WF in a desired position while the layout is printed on the wafer WF.

Although not shown in FIG. 1, the reduction projection device 1600 may include an aperture. The aperture may be used to increase focal depth of the ultraviolet light emitted from the light source 1200. For example, the aperture may include a dipole aperture or a quadruple aperture. In some embodiments, the reduction projection device 1600 may further include a lens to adjust the light focus.

The light emitted from the light source 1200 may pass through the transparent regions included in the image patterns of the mask 1400. The light passing through the mask 1400 may be projected to the wafer WF through the reduction projection device 1600. Thus, a layout that includes circuit patterns corresponding to the image patterns of the mask 1400 may be printed on the wafer WF.

Meanwhile, as integration density in semiconductor processes continues to increase, a distance between the image patterns becomes very close and widths of the transparent regions have been reduced significantly. Due to such "proximity" between transparent regions, optical interference and optical diffraction may occur and a distorted layout different from a desired layout may be printed on the wafer WF. When the distorted layout is printed on the wafer WF, a deigned circuit may operate abnormally.

A resolution enhancement technology is used to prevent a layout from being distorted. Optical proximity correction is an example of a resolution enhancement technology. According to the optical proximity correction, the level of distortion, such as optical interference and optical diffraction, are estimated in advance before the mask 1400 is fabricated. Moreover, image patterns to be formed on the mask 1400 are biased in advance based on the estimated result before the mask 1400 is fabricated. Thus, a desired layout may be printed on the wafer WF.

In some cases, the optical proximity correction may be performed to adjust a layout for a single layer. In a semiconductor process, a semiconductor device may be implemented to include a plurality of layers (for example, a semiconductor device may include a plurality of stacked metal layers to implement a specific circuit). In some embodiments, the optical proximity correction may be independently performed for each of the layers.

However, a result of the optical proximity correction performed for a specific layer may affect another layer. For example, when a layout for a specific layer is excessively biased, image patterns that need to be connected to each other may not be connected, or image patterns that need not to be connected may be connected to each other. Similarly, when a layout for a specific layer is excessively biased, the layout may be undesirably connected to a layout for another layer or layouts that are to be connected may not be connected to each other unintentionally.

Accordingly, in the example embodiments, the optical proximity correction may be performed considering a plurality of layers concurrently, instead of considering only one single layer. For example, rather than taking into consideration single layers in isolation from others of the plurality of layers, when performing optical proximity correction, the disclosed embodiments take into consideration the plurality of layers. In the disclosed embodiments, an optimal margin may be obtained between layouts for a plurality of layers that are disposed at different positions. For example, in the disclosed embodiments, layouts for a plurality of layers may be biased to achieve etch patterns within an acceptable or predetermined threshold, as discussed herein. Hereinafter, the example embodiments will be described more fully with reference to FIGS. 2 to 22.

Figure 2:
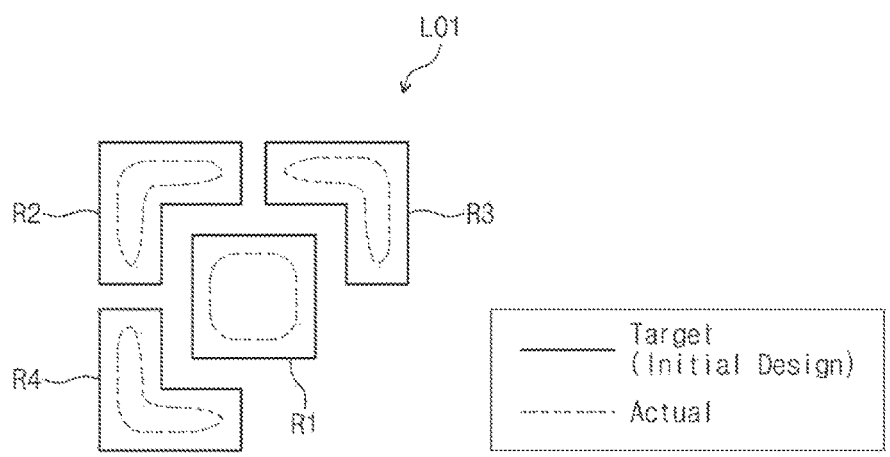
FIG. 2 is a conceptual diagram illustrating a layout on a wafer of FIG. 1.

FIG. 2 is a conceptual diagram illustrating an example layout LO1 printed on the wafer WF of FIG. 1. In FIG. 2, solid lines may denote a "target layout" desired to be printed on the wafer WF, and dotted lines may denote an "actual layout" that is to be actually printed on the wafer WF.

For example, a layout LO1 may include a first circuit pattern R1, a second circuit pattern R2, a third circuit pattern R3, and a fourth circuit pattern R4. However, the number of circuit patterns and the form of the layout LO1, as illustrated in FIG. 2, is an example to help better understanding, and is not intended to limit the present disclosure.

In some example embodiments, a designer of the layout LO1 may intend to print the layout LO1 of the first circuit pattern R1 to the fourth circuit pattern R4 represented by the solid lines of FIG. 2 on the wafer WF. For example, the solid lines of FIG. 2 may correspond to a layout to be printed as a target layout. The target layout may be provided as an "initial" design layout. For example, the designer may provide the target layout, represented as the solid lines of layout LO1, as the initial design layout for printing on the wafer WF. The design layout may be associated with image patterns to be included in the mask 1400 of FIG. 1 to print the target layout on the wafer WF.

However, the mask 1400 may cause distortion, such as optical interference and optical diffraction. Due to this distortion, when the mask 1400 simply includes image patterns corresponding to the solid lines of FIG. 2, the first circuit pattern R1 to the fourth circuit pattern R4 indicated by the dotted lines of FIG. 2 may be printed on the wafer WF. As illustrated in FIG. 2, the dimensions and shapes of the image patterns actually printed on the wafer WF (shown by the dotted lines) can be different than the dimensions and shapes that are desired or intended to be printed on the wafer WF (shown by the solid lines). When a distorted layout (shown by the dotted lines) is printed on the wafer WF, a designed circuit may operate abnormally or in a manner different from its intended operation.

Optical proximity correction may be performed to prevent a layout from being distorted. In the optical proximity correction, a design layout may be biased to reduce an error between a target layout and an actual layout that is actually printed based on a design layout. For example, a design layout including biasing may reduce differences in shape and dimension between the target layout and the actual printed layout. The biasing may be based on predicted distortion caused by optical interference and optical diffraction. When image patterns corresponding to the design layout that is biased based on the predicted distortion are included in the mask 1400, the actual layout that is substantially the same as the target layout (i.e., the actual layout having a small error or within an acceptable threshold of differences) may be printed on the wafer WF. An example of the optical proximity correction will now be described below with reference to FIGS. 3 and 4.

Figure 3:
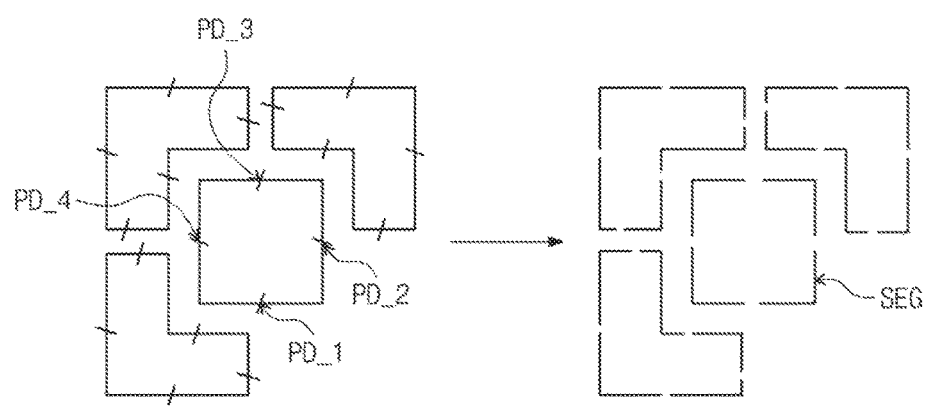
FIG. 3 is a conceptual diagram illustrating a process of dividing an outline of a design layout corresponding to the layout of FIG. 2 into a plurality of segments in optical proximity correction.

FIG. 3 is a conceptual diagram illustrating a process of dividing an outline of a design layout corresponding to the layout LO1 of FIG. 2 into a plurality of segments in certain example embodiments of optical proximity correction. For better understanding, a process of dividing an outline of the design layout indicated by the solid lines of FIG. 2 into a plurality of segments will be described.

A plurality of division points may be set on an outline or perimeter of one or more circuit patterns of a design layout. The plurality of division points may be positions or locations along the outline or perimeter of the one or more circuit patterns. For example, in the example of FIG. 3, the first circuit pattern R1 may include a first division point PD_1, a second division point PD_2, a third division point PD_3, and a fourth division point PD_4 located along its perimeter. One segment SEG may be obtained based on the first division point PD_1 and the second division point PD_2. For example, the segment SEG may include the segment between the first division point PD_1 and the second division point PD_2. Similarly, the outline of the design layout for the second circuit pattern R2 to the fourth circuit pattern R4 may be divided into a plurality of segments based on a plurality of division points. In some embodiments, the plurality of segments may include segments extending between each of the adjacent ones of the first division point PD_1, the second division point PD_2, the third division point PD_3, and the fourth division point PD_4. Additionally and/or alternatively, the plurality of segments may include segments extending between each of the adjacent ones of the first division point PD_1, the second division point PD_2, the third division point PD_3, the fourth division point PD_4, and/or features of the design layout (e.g., corners or other acute angles, etc.).

Although the terms "divide" and "division" are used herein, these terms may not mean physically dividing or a physical division. In some embodiments, the division of a segment may refer to defining one or more sections or portions of the perimeters or outlines of circuit patterns in a design layout. For example, while the plurality of segments is illustrated as being physically divided in FIG. 3, the segments may remain physically connected or contiguous. The illustration is provided for better understanding of the disclosed concepts.

In some example embodiments of the optical proximity correction, each of the divided segments may be a target of biasing. Each of the divided segments may be independently and/or differently biased. For example, a segment SEG may be biased along one of a first direction (e.g., a positive direction or an outward direction) and a second direction (e.g., a negative direction or an inward direction) independently from other segments. In some embodiments, a segment SEG may not be biased in either of the first direction (e.g., a positive direction or an outward direction) or the second direction (e.g., a negative direction or an inward direction). As used herein, biasing may include, for example, moving the outside edges corresponding to the divided segments in one of the first direction or the second direction. Each of the divided segments may be biased to reduce an error between an actual layout and a target layout.

In the optical proximity correction, a "cost function" may be given to each of the divided segments to calculate the error between the actual layout and the target layout. The cost function may include a model (e.g., a mathematical model) associated with the error between the actual layout and the target layout. The cost function may be used to minimize the error between the actual layout and the target layout.

For example, the cost function for the optical proximity correction may be modeled based on an "edge placement error (EPE)". The EPE may mathematically explain a difference between the actual layout and the target layout.

In some embodiments, the optical proximity correction may be performed such that a value of the EPE converges to zero (0). For example, the divided segments may be biased such that the EPE value for each divided segment converges to zero (0). In the optical proximity correction, a bias value used to bias each of the divided segments may be calculated. In certain embodiments, however, actual optical proximity correction and an actual semiconductor process may exhibit an error to some extent. For example, the EPE value in actual optical proximity correction and an actual semiconductor process may not converge to zero (0). Accordingly, in some cases, the actual optical proximity correction may be performed until the error between the actual layout and the target layout reaches a value within an allowable level or below an acceptable threshold.

Figure 4:
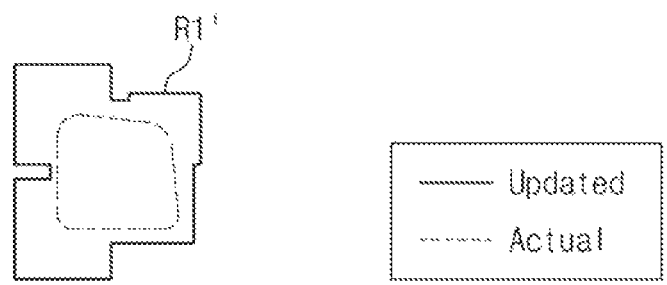
FIG. 4 is a conceptual diagram illustrating a layout updated by the optical proximity correction of FIG. 3.

The concept of the EPE and a process of calculating bias values for optical proximity correction are well known to those skilled in the art. Therefore, their detailed descriptions will be omitted herein. An example of an updated design layout obtained based on the biased segments will be described below with reference to FIG. 4. FIG. 4 is a conceptual diagram illustrating a layout updated by the optical proximity correction of FIG. 3. To help better understanding, a new first circuit pattern R1' updated from the first circuit pattern R1 of FIG. 2 will be described. For brevity, the similar descriptions for the second circuit pattern R2 to the fourth circuit pattern R4 of FIG. 2 will be omitted below.

The solid line of FIG. 4 may denote the new first circuit pattern R1'. As described with reference to FIG. 3, the outline of the first circuit pattern R1 of FIG. 2 may be divided into a plurality of segments, and one or more of the plurality of divided segments may be biased. As illustrated in FIG. 4, each of the segments may include a bias along a first direction (e.g., a positive direction or an outward direction), a bias along a second direction (e.g., a negative direction or an inward direction), or no bias. The new first circuit pattern R1' may be obtained as a result of this biasing. In some embodiments, a desired bias (e.g., positive, negative, none) for each of the segments of the first circuit pattern R1 may be determined, and each of the segments may be shifted or moved in accordance with the desired bias (e.g., shifted in one of a positive direction, a negative direction). In some cases, where at least one segment is shifted or moved in a direction, another segment may not be shifted or moved at all.

Each of the divided segments may be biased to reduce an error between an actual layout and a target layout. For example, the dotted line of FIG. 4 may denote an actual layout to be actually printed on the wafer WF of FIG. 1 based on an updated design layout. As can be seen from the dotted line of FIG. 4, the error between the actual layout printed on the wafer WF and the target layout (i.e., the target layout of the first circuit pattern R1 of FIG. 2) may be reduced by biasing each of the divided segments.

Figure 5:
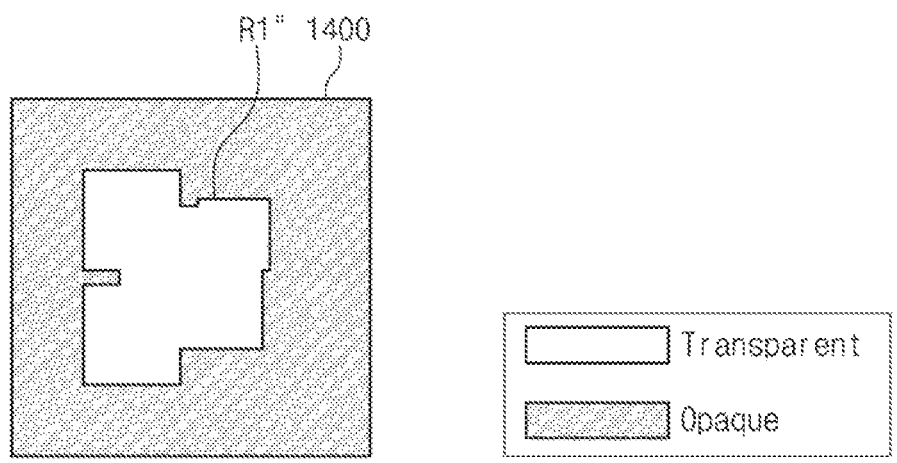
FIG. 5 is a conceptual diagram illustrating a mask fabricated based on the updated layout of FIG. 4.

FIG. 5 is a conceptual diagram illustrating a mask 1400 fabricated based on the updated layout of FIG. 4. To help better understanding, for example, a mask fabricated to include an image pattern corresponding to the new first circuit pattern R1' of FIG. 4 will be described.

The mask 1400 may include a transparent region and an opaque region. Light may not pass through the opaque region and may be blocked out by the opaque region, while the light emitted from the light source 1200 of FIG. 1 may pass through the transparent region. The light passing through the mask 1400 may be projected to the wafer WF of FIG. 1.

The mask 1400 may include image patterns corresponding to a layout updated by optical proximity correction. For example, the mask 1400 may include a layout of a first image pattern R1" corresponding to the new first circuit pattern R1' of FIG. 4. The first image pattern R1" may form a transparent region. Thus, the light passing through the first image pattern R1" may be projected to the wafer WF, and a layout that includes the circuit pattern corresponding to the image pattern R1" may be printed on the wafer WF. In some embodiments, using the new first circuit pattern R1', the circuit pattern printed on the wafer WF may be the targeted first circuit pattern R1. An example of a relationship between the image pattern of the mask 1400 and a circuit pattern printed on the wafer WF will now be described with reference to FIG. 6.

Figure 6:
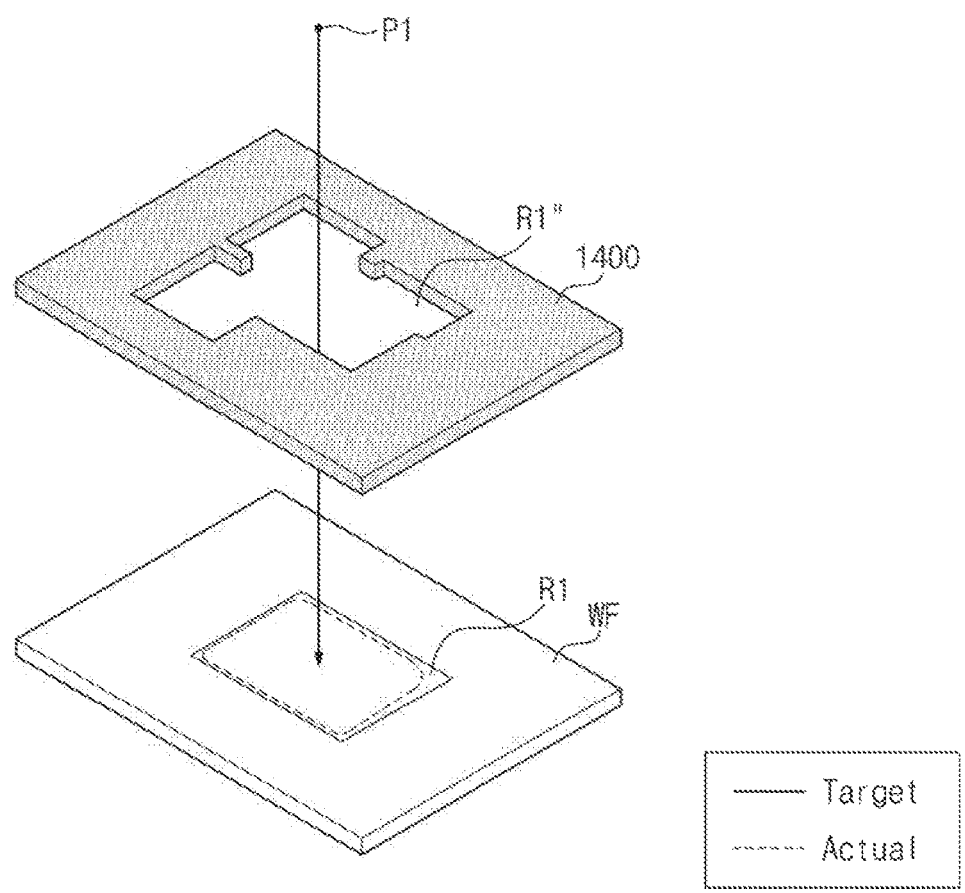
FIG. 6 is a conceptual diagram illustrating a circuit pattern printed on a wafer through an example image pattern included in the mask of FIG. 5.

FIG. 6 is a conceptual diagram illustrating a circuit pattern printed on the wafer WF through an example image pattern included in the mask 1400 of FIG. 5. For example, a relationship between the first circuit pattern R1 of FIG. 2 and the first image pattern R1" of FIG. 5 will now be described.

The point light source P1 included in the example light source 1200 of FIG. 1 may emit light toward the mask 1400. The emitted light may be projected to the wafer WF after passing through the transparent region of the first image pattern R1", and the first circuit pattern R1 corresponding to the first image pattern R1" may be printed on the wafer WF.

As described above, due to distortion such as optical interference and optical diffraction, a circuit pattern printed on the wafer WF may have a different shape from the image pattern of the mask 1400. Accordingly, when the mask 1400 includes an image pattern having the same shape as the first circuit pattern R1 indicated by a solid line of FIG. 6, a circuit pattern distorted from the first circuit pattern R1 may be printed on the wafer WF. To avoid this distortion, the mask 1400 may include a layout of the first image pattern R1" corresponding to the new first circuit pattern R1' that is updated by the optical proximity correction. The first image pattern R1" may be obtained by biasing the outline of the first circuit pattern R1, as disclosed in the example embodiments.

When the mask 1400 includes the first image pattern R1", an actual layout of the dotted line that is substantially identical to a target layout of the solid line (e.g., an actual layout having a small error or being within an acceptable threshold) may be printed on the wafer WF for the first circuit pattern R1. The optical proximity correction may be performed to fabricate the mask 1400 including biased image patterns and to reduce an error between the actual layout and the target layout.

In some cases, optical proximity correction may be performed for a single layer. However, during a semiconductor process, a semiconductor device may be implemented including a plurality of layers to include one or more circuits configured to perform various functions. For this reason, in the example embodiments, the optical proximity correction may be performed considering the plurality of layers together, instead of considering only one single layer. For better understanding, an example semiconductor device will now be described with reference to FIG. 7.

Figure 7:
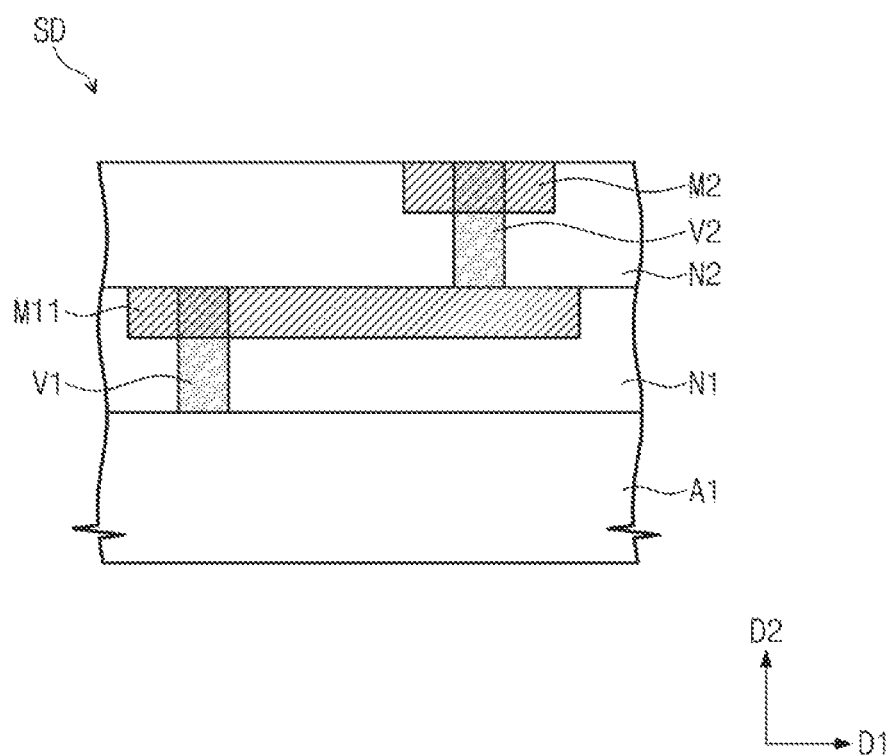
FIG. 7 is a conceptual diagram illustrating a longitudinal section of an example semiconductor device that may be implemented using a mask fabricated according to the example embodiments.

FIG. 7 is a conceptual diagram illustrating a longitudinal section of an example semiconductor device SD that may be implemented using a mask fabricated according to the example embodiments.

The semiconductor device SD may be any type of a semiconductor device. For example, the semiconductor device SD may be a semiconductor device configured to perform at least one of various functions such as operation processing, image processing, communication, data storage, and/or the like. However, the present disclosure is not limited thereto. For example, the semiconductor device may be a semiconductor chip, such as a logic chip or memory chip.

The semiconductor device SD may include a plurality of layers. Each of the layers of the semiconductor device SD may extend along a first direction D1. Furthermore, the layers of the semiconductor device SD may be stacked along a second direction D2, where the second direction D2 is perpendicular to the first direction D1.

For example, the semiconductor device SD may include a layer including a semiconductor material A1. In the semiconductor material A1, current may flow or may not flow in response to an external voltage. For example, the semiconductor material A1 may include doped silicon, but the present disclosure is not limited thereto.

The semiconductor device SD may include a layer including a dielectric material N1 that is provided on the semiconductor material A1. The dielectric material N1 may electrically isolate a metallic material M11 from the semiconductor material A1, insulating the metallic material M11 from the semiconductor material A1 to prevent electrical contact between the metallic material M11 and the semiconductor material A1. The metallic material M11 may transmit an electrical signal. For example, in a semiconductor process, the dielectric material N1 may be filled in an empty space after the metallic material M11 is etched. Alternatively, the dielectric material N1 may be provided first, and then the metallic material M11 may be filled in an empty space after the dielectric material N1 is cut off.

The semiconductor device SD may include a via including a via V1. In some embodiments, the via V1 may be provided in the layer including the dielectric material N1. The via V1 may electrically connect the metallic material M11 with the semiconductor material A1. The via V1 may provide a path to transmit an electrical signal between the metallic material M11 and the semiconductor material A1. For example, a via hole may be formed at a suitable position on the metallic material M11 after the metallic material M11 is provided, and the via hole may be filled with a material for forming the via V1.

The semiconductor device SD may include a layer including a dielectric material N2 provided on the dielectric material N1. The dielectric material N2 may electrically isolate a metallic material M2 from the metallic material M11, insulating the metallic material M2 from the metallic material M11 to prevent electrical contact between the metallic material M2 and the metallic material M11. For example, in a semiconductor process, the dielectric material N2 may be filled in an empty space after the metallic material M2 is etched. Alternatively, the dielectric material N2 may be provided first, and then the metallic material M2 may be filled in an empty space after the dielectric material N2 is cut off.

The semiconductor device SD may include a layer including a via V2. In some embodiments, the via V2 may be provided in the layer including the dielectric material N2. The via V2 may electrically connect the metallic material M2 with the metallic material M11. The via V2 may provide a path to transmit an electrical signal between the metallic material M2 and the metallic material M11. For example, a via hole may be formed at a suitable position on the metallic material M2 after the metallic material M2 is provided, and the via hole may be filled with a material for forming the via V2.

For example, each of the dielectric materials N1 and N2 may include silicon dioxide, and each of the metallic materials M11 and M2 and the vias V1 and V2 may include any conductive material. However, the present disclosure is not limited thereto.

Current flowing in the semiconductor material A1 may be transmitted, as an electrical signal, through the via V1, the metallic material M11, the via V2, and the metallic material M2. In this manner, a semiconductor chip or circuit may be designed to transmit an electrical signal.

To obtain a circuit that operates as intended, the via V1, the metallic material M11, the via V2, and the metallic material M2 may be suitably patterned. Layouts for the via V1, the metallic material M11, the via V2, and the metallic material M2 may be prepared by a designer of the circuit to design the via V1, the metallic material M11, the via V2, and the metallic material M2. The prepared layouts may be biased by optical proximity correction. For example, segments along the outlines or perimeters of the layouts for the via V1, the metallic material M11, the via V2, and the metallic material M2 may be shifted or moved in a first direction (e.g., a positive direction or an outward direction), or a second direction (e.g., a negative direction or an inward direction). When some segments are shifted or moved, others may not be shifted or moved at all. The mask 1400 of FIG. 1 may be fabricated to include image patterns corresponding to the biased layouts. Such a mask 1400 may be used to print circuit patterns corresponding to the via V1, the metallic material M11, the via V2, and the metallic material M2. However, the semiconductor device SD having the configuration described with reference FIG. 7 and other figures is merely provided to help better understanding, and is not intended to limit the present disclosure. The configuration of the semiconductor device SD may be variously changed or modified depending on functions and operations of the semiconductor device SD.

Figure 8:
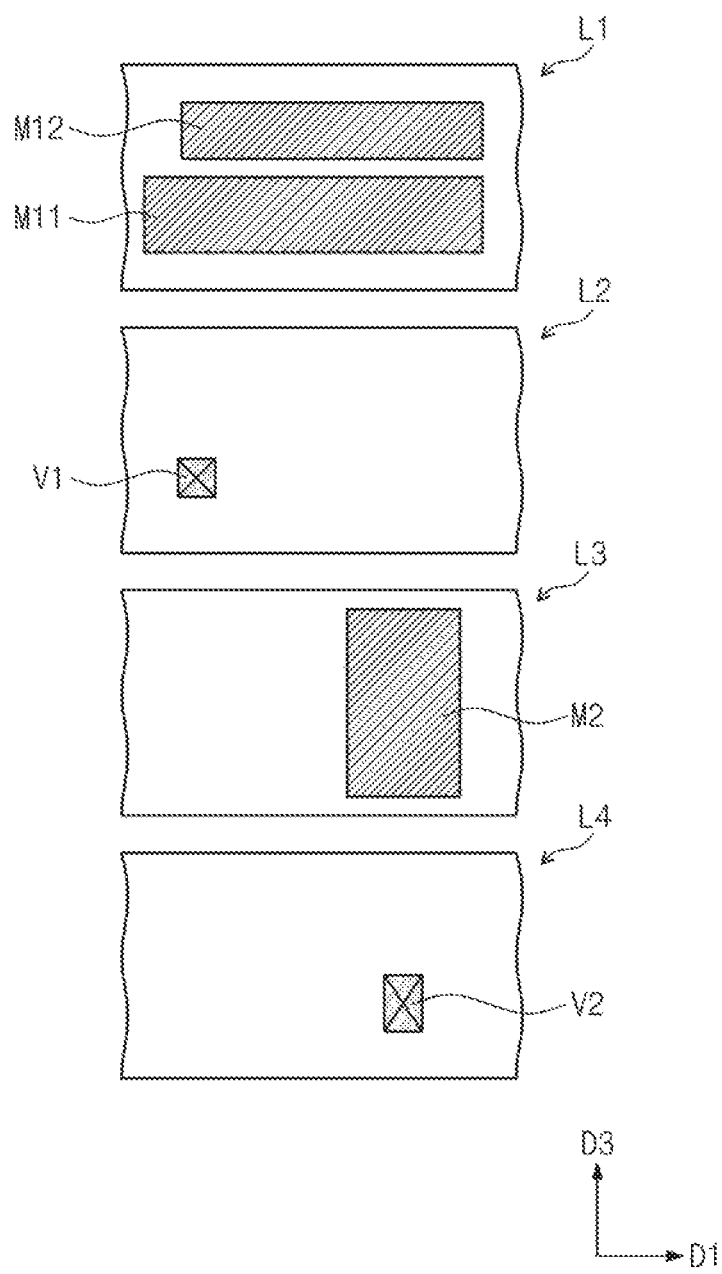
FIG. 8 is a conceptual diagram illustrating design layouts designed to fabricate a mask that is used to implement the example semiconductor device of FIG. 7.

FIG. 8 is a conceptual diagram illustrating design layouts designed to fabricate a mask that is used to implement the example semiconductor device SD of FIG. 7. In the example embodiment of FIG. 8, four example design layouts L1, L2, L3, and L4 are provided. FIG. 8 illustrates planar views defined in a first direction D1 and a third direction D3. The third direction D3 may be perpendicular to both the first direction D1 and the second direction D2 of FIG. 7. To help better understanding, FIGS. 1 and 7 will be referenced together with FIG. 8.

First, a first layout L1 may be prepared for the layer including the metallic material M11. Although not illustrated in FIG. 7, in example embodiments, a metallic material M12 may be included in the same layer together with the metallic material M11. In this example, the first layout L1 may include a design layout for the metallic materials M11 and M12. The first layout L1 may be prepared for first optical proximity correction. In the first optical proximity correction, the outlines of the design layouts for the metallic materials M11 and M12 may be biased. After the first optical proximity correction is performed, a first mask may be fabricated including image patterns that correspond to the biased layout.

A second layout L2 may be prepared for the layer including the via V1. The second layout L2 may be prepared for second optical proximity correction. In the second optical proximity correction, the outline of the design layout for the via V1 may be biased. After the first optical proximity correction is performed, a second mask may be fabricated including image patterns that correspond to the biased layout.

Further, a third layout L3 may be prepared for the layer including the metallic material M2, and a fourth layout L4 may be prepared for the layer including the via V2. The third layout L3 and the fourth layout L4 may be prepared for third optical proximity correction and fourth optical proximity correction, respectively. After the third optical proximity correction and the fourth optical proximity correction are performed, a third mask for the layer including the metallic material M2 and a fourth mask for the layer including the via V2 may be fabricated, and may include image patterns that corresponds to the biased layouts.

Each of the first to fourth masks may be used as the mask 1400 in the photolithography system 1000 (e.g., different of the masks can be used to perform a photolithography process on different respective layers of a semiconductor device). Thus, circuit patterns respectively corresponding to the first layout L1, the second layout L2, the third layout L3, and the fourth layout L4 may be printed on the wafer WF.

Figure 9:
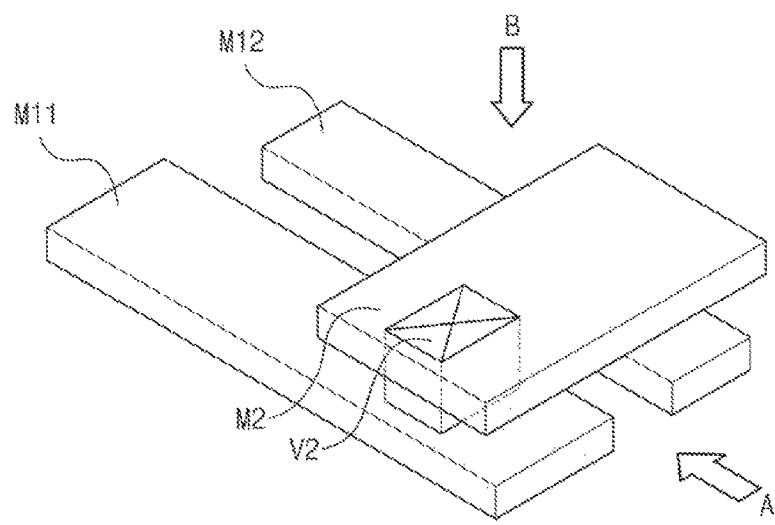
FIG. 9 is a conceptual diagram illustrating a plurality of layers included in the example semiconductor device of FIG. 7.
Figure 9:
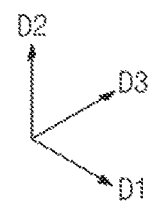
Figure 10:
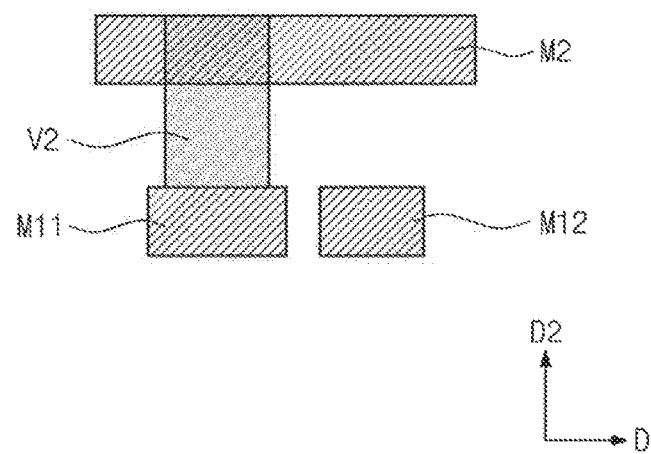
FIG. 10 is a conceptual diagram illustrating a side surface where the layers of FIG. 9 are viewed from a side 'A' of FIG. 9.

FIG. 9 is a conceptual diagram illustrating a plurality of layers included in the example semiconductor device SD of FIG. 7. FIG. 10 is a conceptual diagram illustrating a side surface where the layers of FIG. 9 are viewed from a side 'A' of FIG. 9, and FIG. 11 is a conceptual diagram illustrating a top surface where the layers of FIG. 9 are viewed from a side 'B' of FIG. 9.

Referring to FIG. 9, the perspective view conceptually illustrates dispositions of the metallic materials M11, M12, and M2 and the via V2 that are included in the semiconductor device SD of FIG. 7. When masks (e.g., the first to fourth masks) that are fabricated by performing optical proximity corrections (e.g., the first to fourth optical proximity correction) based on the layouts L1 to L4 of FIG. 8 are used, a circuit having the configuration illustrated in FIG. 9 may be implemented. In this example, the metallic material M2 may be electrically connected to the metallic material M11 through the via V2. However, the metallic material M2 may not be connected to the metallic material M12.

Referring to FIG. 10, connections between the metallic materials M11, M12, and M2 may be understood more clearly. After the layer including the metallic materials M11 and M12 is provided, the layer including the metallic material M2 may be provided. Afterwards, in some embodiments, a via hole for the via V2 may be formed, and the via V2 may connect the metallic materials M2 and M11 with each other. However, a via may not be provided between the metallic materials M2 and M12.

Figure 11:
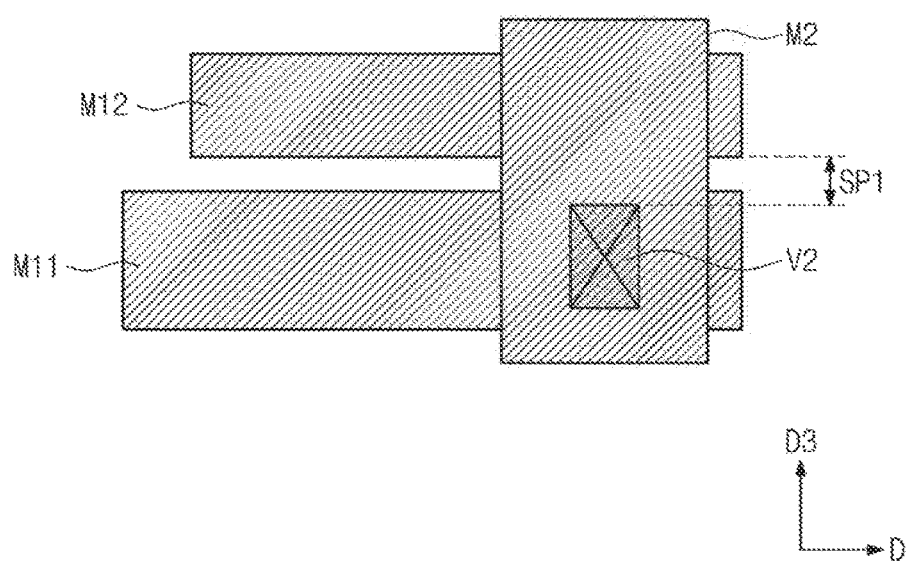
FIG. 11 is a conceptual diagram illustrating a top surface where the layers of FIG. 9 are viewed from a side 'B' of FIG. 9.

Referring to FIG. 11, a space SP1 may be provided between a pattern of the via V2 and a pattern of the metallic material M12. Since the metallic material M2 and the metallic material M12 are not connected with each other, the pattern of the via V2 may be spaced apart from the pattern of the metallic material M12 by the space SP1 on a plane defined in the first direction D1 and the third direction D3. Thus, the metallic material M2 may be electrically isolated from the metallic material M12.

Figure 12:
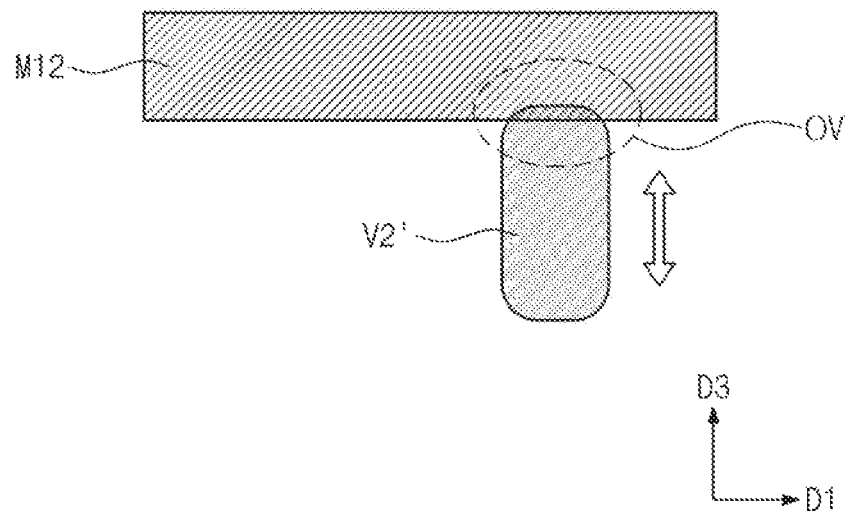
FIGS. 12 and 13 are conceptual diagrams for describing problems of over-etching and short-circuit that may occur in the example semiconductor device of FIG. 7.
Figure 13:
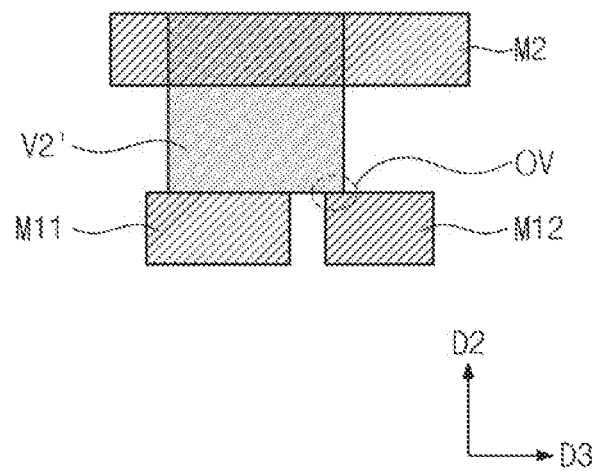

FIGS. 12 and 13 are conceptual diagrams for describing the over-etching and short-circuiting that may occur in the example semiconductor device SD of FIG. 7.

As described above, optical proximity correction may be performed on the fourth layout L4 of FIG. 8 to form the via V2 of FIG. 7. In the optical proximity correction, the outline of the design layout for the via V2 may be divided into a plurality of segments, and the divided segments may be biased.

However, in some cases, the outline of the design layout for the via V2 may be excessively biased. Since the optical proximity correction is performed considering a relationship with neighboring segments (e.g., within the same layer), for example, excessive bias may occur depending on a neighboring environment (e.g., neighboring or adjacent layers). In some other cases, excessive bias may occur due to a calculation error. When a mask fabricated based on excessive bias is used, an over-etched via V2' may be obtained, as illustrated in FIG. 12. In this case, an overlapping area OV may be formed in which a pattern of the via V2' overlaps a pattern of the metallic material M12.

Referring to FIG. 13, the via V2' is short-circuited with the metallic material M12 in the overlapping area OV. In this case, although the metallic material M2 should be isolated from the metallic material M12, the metallic material M2 may be electrically connected with the metallic material M12 unintentionally. As a result, an electrical signal may be transmitted between the metallic material M2 and the metallic material M12, and thus an error may occur in an operation of a circuit.

When an erroneous bias occurs during optical proximity correction, a circuit pattern may be unintentionally over-etched, and a circuit may operate abnormally. These problems may be caused when the optical proximity correction is performed considering only a single layer. Accordingly, in the example embodiments, optical proximity correction for a specific layer may be performed taking into consideration its relationship with a layout of another layer.

Figure 14:
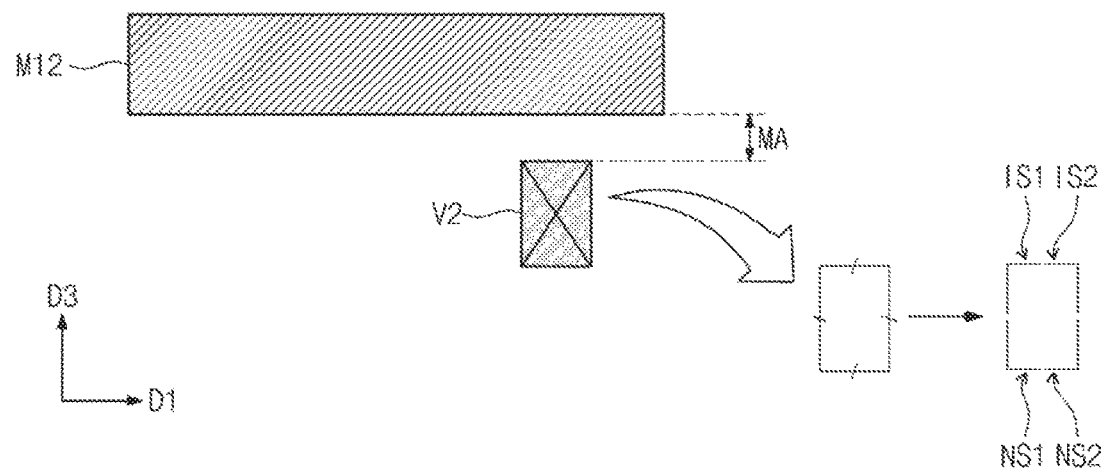
FIG. 14 is a conceptual diagram for describing optical proximity correction performed to fabricate a mask according to the example embodiments.

FIG. 14 is a conceptual diagram for describing optical proximity correction performed to fabricate a mask according to the example embodiments. Referring to FIG. 14, a relationship between a pattern of the metallic material M12 and a pattern of the via V2 will be described.

As described above, the pattern of the via V2 may not be connected with the pattern of the metallic material M12. A margin MA may be provided to prevent the outline of the design layout for the via V2 from being excessively biased during optical proximity correction. The margin MA may be a "minimum" allowable space between the outline of the layout for the via V2 and the outline of the layout for the metallic material M12, to separate the pattern of the via V2 from the pattern of the metallic material M12. In some embodiments, the margin MA may be defined relative to the outline of the layout for the metallic material M12. For example, an allowable boundary around the outline of the layout for the metallic material M12 may be formed by the margin MA such that the allowable boundary is parallel to and space apart from the outline of the layout for the metallic material M12 by a distance defined by the width of the margin MA.

In the example embodiments, a design layout for the layer including the metallic material M12 may be obtained while optical proximity correction is performed on a design layout for the layer including the via V2. For example, a design layout within a reference distance from the outline of the layout corresponding to the via V2 may be obtained. The reference distance may be selected to have any value that is suitable for performing optical proximity correction such that excessive bias is prevented.

When optical proximity correction is performed for the layer including the via V2, the optical proximity correction may be performed not only considering the layer including the via V2 but also considering the layer including the metallic material M12. For example, instead of considering only the layer including the via V2, the optical proximity correction may take into consideration both the layer including the metallic material M12 and the layer including the via V2. The optical proximity correction may be performed such that the outline of the layout corresponding to the via V2 is spaced apart from the outline of the layout corresponding to the metallic material M12 by a value of the margin MA. The margin MA may be set to have a value that is suitable for separating the pattern of the via V2 from the pattern of the metallic material M12 when the optical proximity correction is performed.

As described above, an outline of a design layout for a target layer of optical proximity correction may be divided into a plurality of segments. In the example of FIG. 14, the outline of the layout corresponding to the via V2 that is a target of optical proximity correction may be divided at a plurality of division points to obtain a plurality of divided segments.

In the example embodiments, the divided segments may include normal segments NS1 and NS2 and "interest segments" IS1 and IS2. The interest segments IS1 and IS2 may include segments that may be biased taking into account the outline of the layout corresponding to the metallic material M12 (e.g., segments that may be adjacent to the outline of the layout corresponding to the metallic material M12). On the other hand, the normal segments NS1 and NS2 may include segments that may be biased irrespective of the layout corresponding to the metallic material M12.

Each of the normal segments NS1 and NS2 may be biased according to the optical proximity correction, as described with reference to FIGS. 2 to 6. A cost function given to each of the normal segments NS1 and NS2 may include a model to minimize an error between a target layout and an actual layout. For example, since the normal segments NS1 and NS2 may not be adjacent to the outline of the layout corresponding to the metallic material M12, each of the normal segments NS1 and NS2 may be biased during the optical proximity correction without taking into account the layout corresponding to the metallic material M12.

On the other hand, each of interest segments IS1 and IS2 may be biased with consideration of the margin MA such that the pattern of the via V2 does not overlap the pattern of the metallic material M12. A cost function given to each of the interest segments IS1 and IS2 may include a model associated with the allowable margin MA between each of the interest segments IS1 and IS2 and the outline of the layout corresponding to the metallic material M12.

In the example embodiments, the cost function given to each of the interest segments IS1 and IS2 may be different from the cost function given to each of the normal segments NS1 and NS2. Unlike the cost function given to each of the normal segments NS1 and NS2, the cost function given to each of the interest segments IS1 and IS2 may take into consideration the margin MA. For example, during the optical proximity correction for the layer including the via V2, each of the interest segments IS1 and IS2 may be biased up to the boundary defined by the margin MA.

In some example embodiments, the cost function given to each of the normal segments NS1 and NS2 may be determined such that a value of EPE converges to zero (0), as can be understood from Equation (1) below.

$$\text{cost function} = \lim_{\Delta EPE \to 0} \Delta EPE \qquad \text{Equation (1)}$$

Optical proximity correction based on the cost function of the above Equation (1) may be performed according to the process described with reference to FIGS. 2 to 6.

On the other hand, the cost function given to each of the interest segments IS1 and IS2 may be determined such that it takes into consideration a space Esp between the layout corresponding to the via V2 and the layout corresponding to the metallic material M12, as can be understood from Equation (2) below.

$$\text{cost function} = \lim_{Esp \to set\ value} |Esp| \qquad \text{Equation (2)}$$

In the above Equation (2), the space Esp may be defined with relation to the margin MA, as shown in Equation (3) below.

$$Esp = \Delta EPE + MA \qquad \text{Equation (3):}$$

The cost function given to each of the interest segments IS1 and IS2 may include a model associated with the margin MA. The cost function given to each of the interest segments IS1 and IS2 may be designed such that a value of the space Esp converges into a set value. During actual proximity correction, each of the interest segments IS1 and IS2 may be biased to minimize a difference between the value of the space Esp and the set value. For example, the set value may be determined to have a value that is suitable for spacing the pattern of the via V2 apart from the pattern of the metal material M12 by at least a value of the margin MA.

In the above Equation (3), the value of the EPE and the value of the margin MA are expressed as being added to each other. However, the addition may not mean an arithmetic addition. For example, the Equation (3) may reflect embodiments in which the model associated with the margin MA is combined with the model associated with the EPE, instead of separately implementing the models associated with the EPE and the margin MA and then adding them.

Figure 15:
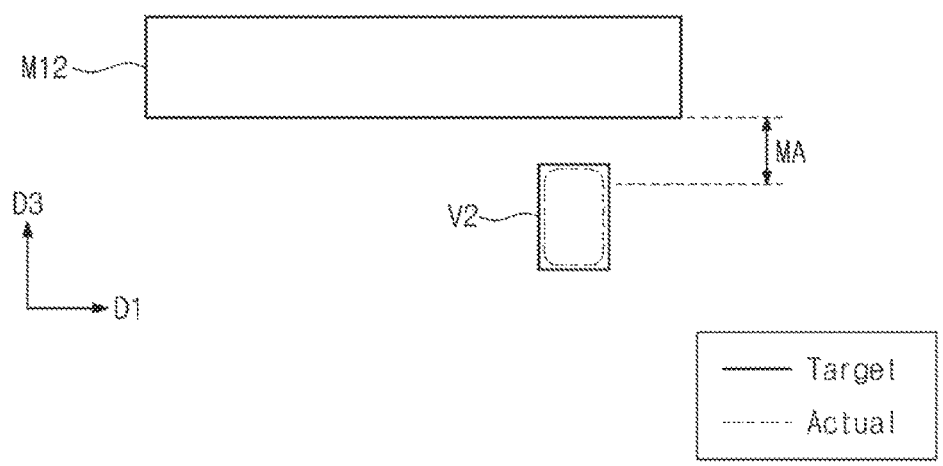
FIGS. 15 and 16 are conceptual diagrams for describing a process of securing a minimum margin between layouts associated with the layers of FIG. 9, according to the optical proximity correction of FIG. 14.
Figure 16:
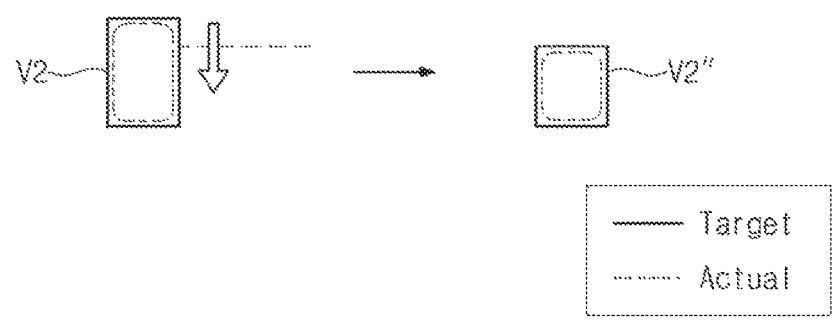

FIGS. 15 and 16 are conceptual diagrams for describing a process of securing a minimum margin between layouts associated with the layers of FIG. 9, according to the optical proximity correction of FIG. 14.

First, the layout corresponding to the via V2 that does not satisfy the margin MA will be described with reference to FIG. 15. The layout corresponding to the metallic material M12 may be obtained to perform optical proximity correction on a design layout for the layer including the via V2.

In some cases, as illustrated in FIG. 15, the layout corresponding to the via V2 may be excessively biased while the optical proximity correction is performed on the design layout for the layer including the via V2. In this case, a space between the outline of the layout corresponding to the via V2 and the outline of the layout corresponding to the metallic material M12 may become shorter than the margin MA. As described above, excessive bias may cause printing of an erroneous circuit pattern and malfunction of a designed circuit. Thus, the optical proximity correction performed on the layout for the layer including the via V2 may be performed to secure the margin MA.

For example, referring to FIG. 16, a target layout for the via V2 may be adjusted in a direction to be decreased to secure the margin MA. Upon adjustment, a target layout corresponding to a via VT' may be obtained. When optical proximity correction is performed on a design layout for the layer including the via V2, it may be performed taking into consideration a target layout corresponding to the via V2", instead of considering the target layout corresponding to the via V2. Thus, the minimum margin MA may be secured between the outline of the layout corresponding to the via V2 and the outline of the layout corresponding to the metallic material M12.

In the example embodiments, optical proximity correction may be performed considering a plurality of layers. When a minimum allowable margin is not satisfied between layouts associated with the plurality of layers disposed at different positions, the outline of a target layout may be adjusted. The optical proximity correction may be performed within the adjusted outline of the target layout, and the minimum margin may be maintained.

Figure 17:
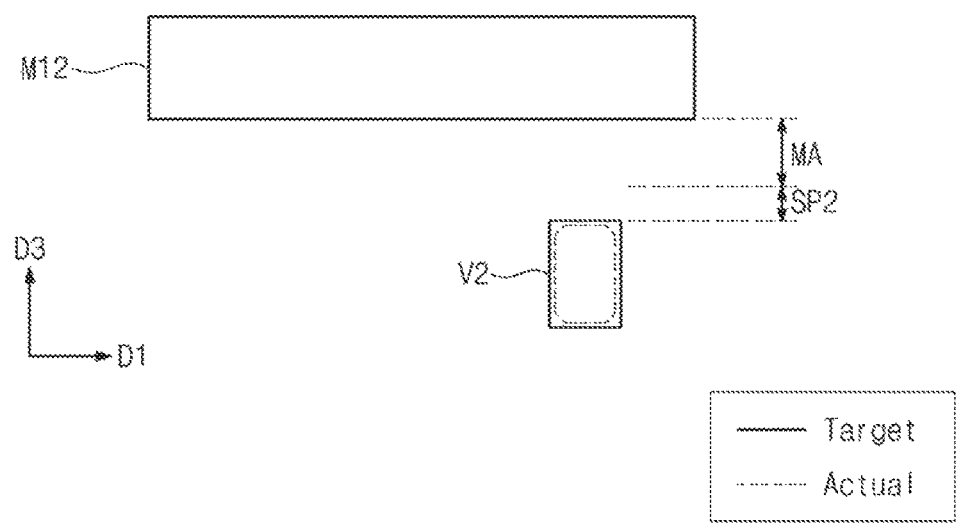
FIGS. 17 and 18 are conceptual diagrams for describing a process of optimizing an area of a layout for a via layer of FIG. 7, according to the optical proximity correction of FIG. 14.
Figure 18:
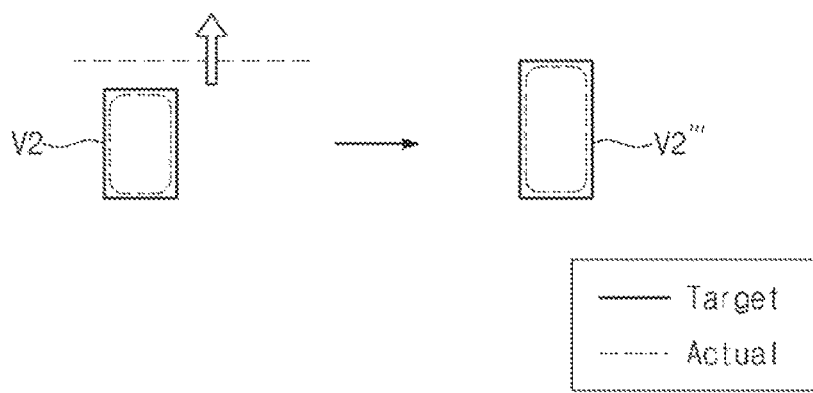

FIGS. 17 and 18 are conceptual diagrams for describing a process of optimizing an area of a layout for a layer including a via, such as the layer of FIG. 7 that includes via V2, according to the optical proximity correction of FIG. 14.

In some cases, as illustrated in FIG. 17, a layout corresponding to the via V2 may be biased to satisfy the margin MA while optical proximity correction is performed on a design layout for the layer including the via V2. In this case, a space SP2 may be provided between the outline of the layout corresponding to the via V2 and a boundary defined by the margin MA.

The layout corresponding to the via V2 may be referred to when forming a via hole. The wider the via hole for the via V2 is in the layout corresponding to the via V2, the more advantageous it is when forming the via V2. For example, it may be advantageous to maximize an area of the layout corresponding to the via V2.

Referring to FIG. 17, it may be allowable to further expand the layout corresponding to the via V2 in a given direction (e.g., direction D3) as much as a space SP2. This is because it may be sufficient to secure the margin MA between the outline of the layout corresponding to the via V2 and the outline of the layout corresponding to the metallic material M12. Accordingly, in the optical proximity correction for the layer including the via V2, the layout corresponding to the via V2 may be further expanded as much as the space SP2, and an area of the layout corresponding to the via V2 may increase.

For example, referring to FIG. 18, the target layout for the via V2 may be adjusted in a direction to be expanded up to the boundary defined by the margin MA. For example, the layout corresponding to the via V2 may be extended in a direction approaching the boundary defined by the margin MA (e.g., direction D3) such that the area of the via V2 is increased. Accordingly, a target layout corresponding to a via V2''' may be obtained. Optical proximity correction performed on the design layout for the layer including the via V2 may be performed considering the target layout corresponding to the via V2''', instead of considering the target layout corresponding to the via V2. In some embodiments, an area of the layout corresponding to the via V2 may be maximized.

When the area of the layout corresponding to the via V2 is maximized, an area of a region for forming a via hole may be maximized and the via V2 may be formed more easily. In the example embodiments, the space SP2 may be utilized to secure a maximum area of a layout for a via layer.

In the example embodiments, optical proximity correction may be performed considering a plurality of layers. When a space greater than an allowable space is provided between layouts associated with a plurality of layers that are disposed at different positions, the outline of a target layout may be adjusted. The outline of the target layout may be adjusted up to the boundary defined by the margin MA. Afterwards, the optical proximity correction may be performed such that the design layout is biased up to the adjusted outline of the target layout. Thus, an area of the layout for a via layer may be optimized (e.g., maximized).

Figure 19:
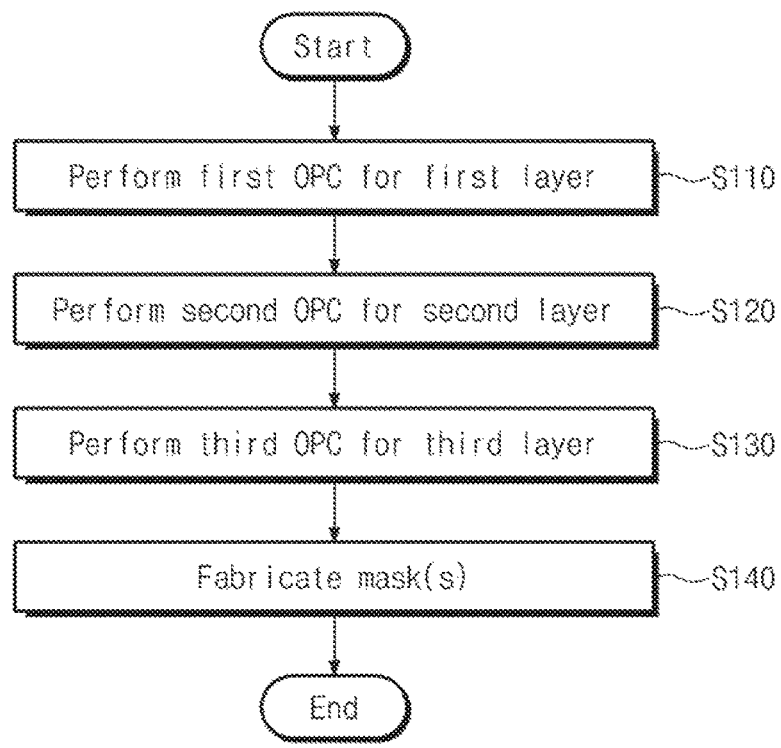
FIG. 19 is a flowchart describing a method for fabricating masks used to implement the semiconductor device of FIG. 7 according to the example embodiments.

FIG. 19 is a flowchart describing a method for fabricating masks used to implement the semiconductor device SD of FIG. 7 according to the example embodiments. To improve understanding, FIGS. 7 to 9 will be referenced together with FIG. 19.

In operation S110, first optical proximity correction may be performed for a first layer. For example, the first layer may be a layer including the metallic materials M11 and M12. In example embodiments, the first optical proximity correction may be performed based on the cost function of the Equation (1) according to the process described with reference to FIGS. 1 and 6.

In operation S120, second optical proximity correction may be performed for a second layer. The second layer may be a layer provided on the first layer (e.g., the second layer may be a spatially upper layer relative to the first layer or the second layer may be located above the first layer). For example, the second layer may be a layer including the metallic material M2. The second optical proximity correction may be performed on the second layer based on the cost function of the Equation (1) according to the process described with reference to FIGS. 2 to 6.

In operation S130, third optical proximity correction may be performed for a third layer. The third layer may be a via layer connecting the first layer to the second layer. For example, the third layer may be a layer including the via V2. The third optical proximity correction may be performed on the third layer based on the cost function of the Equation (2) according to the process described with reference to FIGS. 14 to 18. In the example embodiments, the third optical proximity correction may be performed taking into consideration a plurality of layers that are each disposed at different positions (e.g., disposed at layers that are spatially diverse from one another). The optical proximity correction for the third layer may be performed in a different manner from the optical proximity correction for the first layer and the optical proximity correction for the second layer. The operation S130 will be described in detail later with reference to FIG. 20.

In operation S140, one or more masks may be fabricated. The masks may be fabricated based on results of the first optical proximity correction of the operation S110, the second optical proximity correction of the operation S120, and the third optical proximity correction of the operation S130. The masks fabricated in the operation S140 may be used to implement a semiconductor device (e.g., the semiconductor device SD of FIG. 7) in the photolithography system 1000 of FIG. 1.

Figure 20:
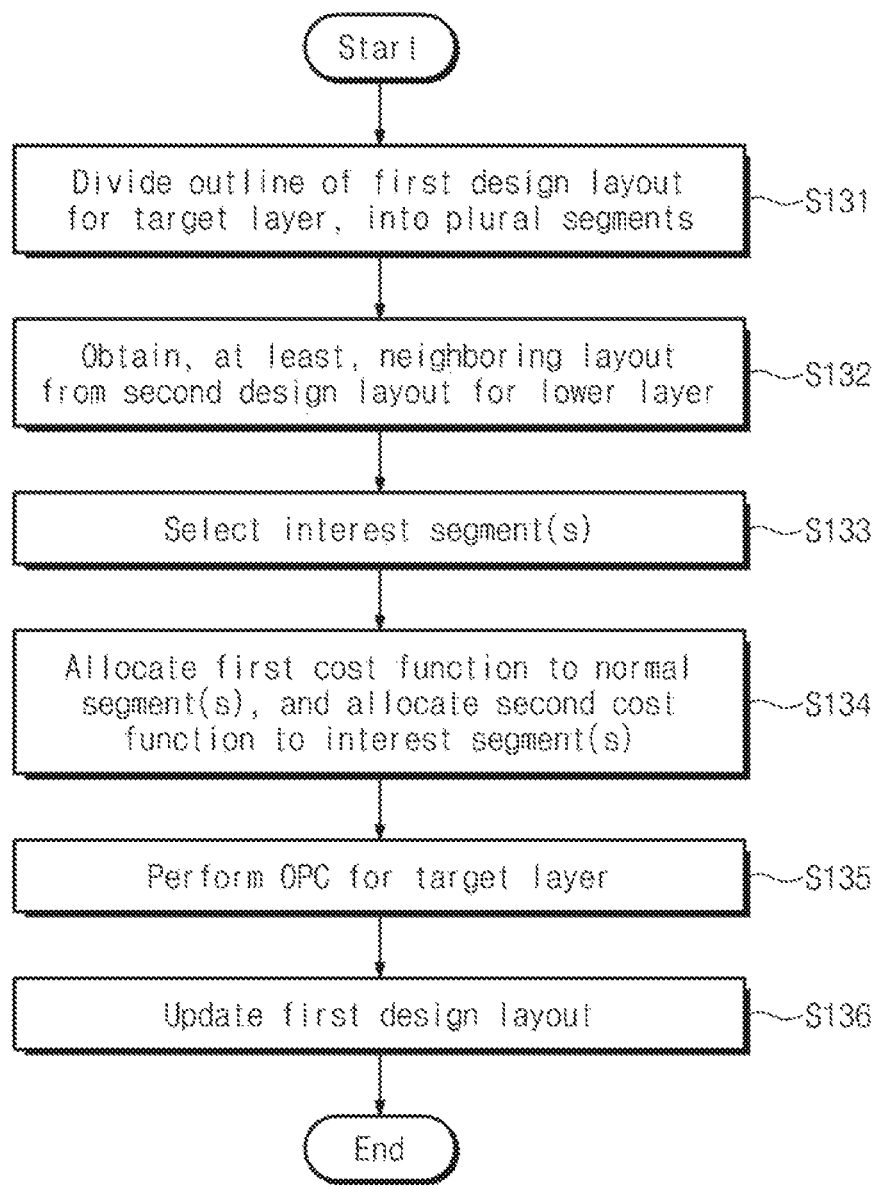
FIG. 20 is a detailed flowchart describing an operation of performing the third optical proximity correction of FIG. 19.

FIG. 20 is a detailed flowchart describing an operation of performing the third optical proximity correction of FIG. 19. The third optical proximity correction of FIG. 19 (i.e., operation S130) may include operations S131 to S136 of FIG. 20. To help better understanding, FIGS. 7 to 9 will be referenced together with FIG. 19.

In operation S131, the outline of a first design layout for a target layer (e.g., the third layer including the via V2 of the operation S130) may be divided into a plurality of segments to perform optical proximity correction. The target layer may be a layer that is a target of optical proximity correction (e.g., the third optical proximity correction of the operation S130).

In operation S132, a "neighboring layout" may be obtained. A neighboring layout may be a layout that takes into account a neighboring or adjacent layer. For example, the neighboring layout may be included in a second design layout for a lower layer (e.g., the layer including the metallic material M12) of the target layer. The lower layer of the target layer may be a layer that is spatially lower than or below the target layer (i.e., the target layer may be at a different position from the lower layer). When viewed from an overhead or perspective view, the neighboring layout may be disposed at a position that does not overlap the first design layout, and may be disposed within a reference distance from the outline of the first design layout. For example, the neighboring layout may correspond to at least a portion of the second design layout that has a high possibility of overlapping the first design layout. In some cases, the neighboring layout may correspond to the entire portion of the second design layout.

For example, returning to FIGS. 14 and 15, when viewed from a direction parallel to the direction D2, the layout corresponding to the metallic material M12 may be disposed at a position that does not overlap the layout corresponding to the via V2 in either the direction D1 or the direction D3. However, the layout corresponding to the metallic material M12 may be disposed within the reference distance from the layout corresponding to the via V2. Thus, for example, the layout corresponding to the metallic material M12 may have a higher possibility of overlapping the layout corresponding to the via V2. In some embodiments, the neighboring layout including the layout corresponding to the metallic material M12 may be obtained during the optical proximity correction for the layer including the via V2. Moreover, the optical proximity correction for the layer including the via V2 may be performed considering the margin MA.

Returning to FIG. 20, the operation S132 may be performed by loading data associated with the second design layout or the neighboring layout stored in a memory device or a storage device. The neighboring layout may not be a target of optical proximity correction, but the neighboring layout may be referred to when performing optical proximity correction on the target layer.

In some example embodiments, the lower layer may correspond to a metal layer including a metallic material. Furthermore, the target layer may correspond to a via layer including a via that connects the lower layer with an upper layer (e.g., the layer including the metallic material M2) to be provided on the lower layer.

In operation S133, one or more interest segments may be selected. As described with reference to FIG. 14, the segments divided in the operation S131 may include some interest segment(s) (e.g., IS1 and IS2) and some normal segment(s) (e.g., NS1 and NS2). The interest segments may be one or more segments that are to be biased in a direction approaching the outline of the second design layout (e.g., in a positive or outward direction or extending in a direction toward the outline of the second design layout). The normal segments may include segment(s) which is not the interest segment.

In operation S134, a cost function may be given to each of the plurality of divided segments. For example, a first cost function may be given to each of the normal segments, and a second cost function may be given to each of the interest segments. The first cost function may include a model to minimize an error between a target layout and an actual layout (e.g., the example cost function of Equation (1)). On the other hand, the second cost function may include a model associated with an allowable margin between the interest segment and the second design layout (e.g., the example cost function of Equation (2)).

In operation S135, optical proximity correction for the target layer may be performed. In this optical proximity correction, a normal segment may be biased based on the first cost function according to the optical proximity correction described with reference to FIGS. 2 to 6. In addition, an interest segment may be biased based on the second cost function according to the optical proximity correction described with reference to FIGS. 14 to 18. The interest segment may be biased in a different manner from the normal segment.

In some embodiments, the interest segment may be biased in a direction of reducing a layout to secure the margin MA, as described with reference to FIGS. 15 and 16. For example, the interest segment may be biased in a direction to be expanded up to the boundary defined by the margin MA, as described with reference to FIGS. 17 and 18. For example, the interest segments may be biased in an outward direction up to an allowable boundary defined by the margin MA.

In some example embodiments, the operation S135 may be repeated until each of the interest segments is biased up to the allowable boundary. For example, if all of the interest segments are not biased up to the allowable boundary, the operation S135 may be repeatedly performed. Accordingly, the optimal margin MA may be obtained between the interest segments and the outline of the neighboring layout, and an area of the layout for the via V2 may be optimized.

In operation S136, the first design layout may be updated. The first design layout may be updated based on a result of the optical proximity correction in the operation S135. The updated first design layout may be referred to when fabricating the mask in the operation S140 of FIG. 19. The operation S136 may be understood in the similar context as that described with reference to FIGS. 4 to 6.

Figure 21:
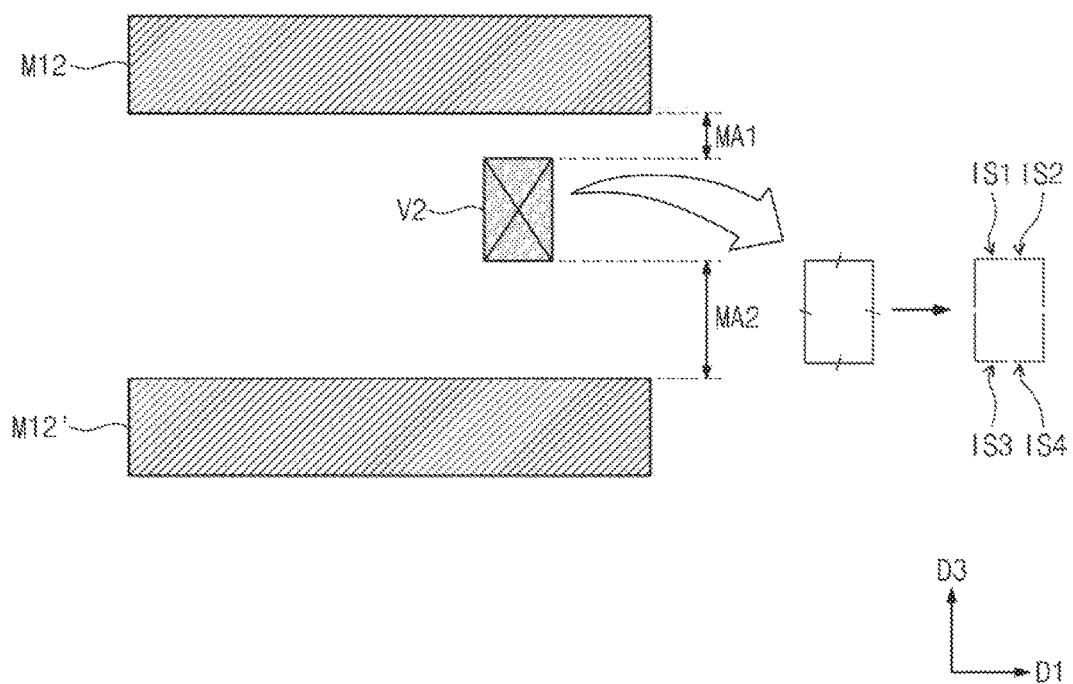
FIG. 21 is a conceptual diagram for describing a margin and an identification marker that are referred in optical proximity correction according to the example embodiments.

FIG. 21 is a conceptual diagram for describing a margin and an identification marker that are referred in optical proximity correction according to the example embodiments.

As described above with reference to FIG. 14, the divided segments may include at least one normal segment and at least one interest segment. While the normal segment may be biased irrespective of the margin MA, the interest segment may be biased up to the allowable boundary defined by the margin MA.

However, in some example embodiments, a plurality of margins MA1 and MA2 may be used. For example, when both a layout corresponding to the metallic material M12 and a layout corresponding to a metallic material M12' are within a reference distance from the layout corresponding to the via V2, the margin MA1 may be provided between the layout corresponding to the metallic material M12 and the layout corresponding to the via V2, and the margin MA2 may be provided between the layout corresponding to the metallic material M12' and the layout corresponding to the via V2. As illustrated in FIG. 21, the reference distances from different layouts may be different. For example, the reference distance between the layout corresponding to the metallic material M12 and the layout corresponding to the via V2 may smaller than the reference distance between the layout corresponding to the metallic material M12' and the layout corresponding to the via V2.

The outline of the layout corresponding to the via V2 may be divided into a plurality of segments. In the example of FIG. 21, the divided segments may include interest segments IS1, IS2, IS3, and IS4. The interest segments IS1 and IS2 may be biased up to an allowable boundary defined by the margin MA1, and the interest segments IS3 and IS4 may be biased up to an allowable boundary defined by the margin MA2.

In some example embodiments, values of the margins MA1 and MA2 may be set to be different for the interest segments IS1, IS2, IS3, and IS4. The value of the margin MA1 may be different from the value of the margin MA2. For example, the value of margin MA1 may be smaller than the value of the margin MA2. The allowable boundary for biasing the interest segments IS1 and IS2 may be different from the allowable boundary for biasing the interest segments IS3 and IS4. Each of the margins MA1 and MA2 may have any suitable value such that a pattern of the via V2 does not overlap patterns of the metallic materials M12 and M12'. In some embodiments, the maximum value of the margin MA1 may correspond to the reference distance between the layout corresponding to the metallic material M12 and the layout corresponding to the via V2, and the maximum value of the margin MA2 may correspond to the reference distance between the layout corresponding to the metallic material M12' and the layout corresponding to the via V2.

The same (or similar) cost function as the cost function expressed in the Equation (2) may be given to each of the interest segments IS1, IS2, IS3, and IS4. However, when the value of the margin MA1 is different from the value of the margin MA2, the corresponding cost functions may include different models. For example, the cost function given to each of the interest segments IS1 and IS2 may include a model associated with the margin MA1, and the cost function given to each of the interest segments IS3 and IS4 may include a model associated with the margin MA2.

In some example embodiments, an identification marker may be allocated to at least one of the interest segments IS1, IS2, IS3, and IS4, and the identification marker may identify which margin among the different margins MA1 and MA2 is associated with the interest segments IS1, IS2, IS3, and IS4. When optical proximity correction is performed on a design layout for the layer including the via V2, the identification marker allocated to at least one of the interest segments IS1, IS2, IS3, and IS4 may be used to identify the corresponding margin. In the optical proximity correction, a value of a margin associated with a specific interest segment may be identified based on the identification marker, and the specific interest segment may be biased up to an allowable boundary defined by the identified margin.

Figure 22:
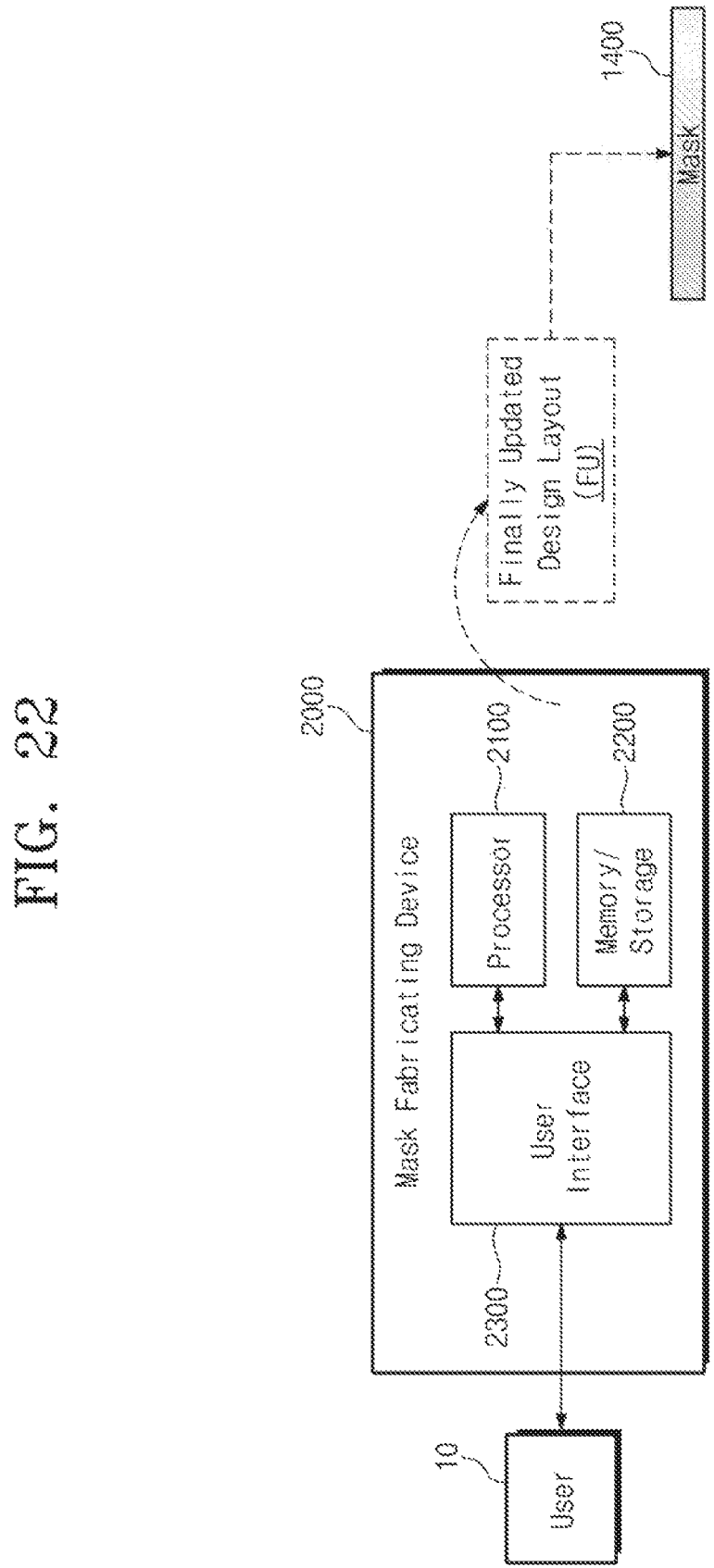
FIG. 22 is a block diagram illustrating a mask fabricating device that may operate according to the example embodiments.

FIG. 22 is a block diagram illustrating a mask fabricating device 2000 that may operate according to the example embodiments. The mask fabricating device 2000 may include a processor 2100, a memory/storage 2200, and a user interface 2300. The mask fabricating device 2000 may be used to fabricate the mask 1400 according to the example embodiments described with reference to FIGS. 2 to 21.

The processor 2100 may include at least one of a general-purpose processor (e.g., a central processing unit (CPU) and/or the like) and a special-purpose processor (e.g., a workstation processor and/or the like). The processor 2100 may be configured to perform various arithmetic operations and/or logical operations to perform dividing, setting, selecting, calculating, obtaining, giving, allocating, updating, etc., as described with reference to FIGS. 2 to 21. To achieve this, the processor 2100 may include at least one processor core. For example, the processor core of the processor 2100 may include a special-purposed logic circuit, such as field programmable gate array (FPGA), application specific integrated chips (ASICs), and/or the like.

The memory/storage 2200 may temporarily or semi-permanently store data processed or to be processed by the processor 2100 (e.g., configured for pre-process and post-process data storage). To achieve this, the memory/storage 2200 may include a volatile memory (e.g., a dynamic random access memory (DRAM), a static RAM (SRAM), a synchronous DRAM (SDRAM), and/or the like) and/or a nonvolatile memory (e.g., a flash memory, a phase-change RAM (PRAM), a magneto-resistive RAM (MRAM), a resistive RAM (ReRAM), a ferroelectric RAM (FRAM), etc.).

For example, the memory/storage 2200 may store data associated with design layouts of a plurality of layers. The data stored in the memory/storage 2200 may be loaded while optical proximity correction is performed. In the example embodiments, when optical proximity correction is performed on a design layout for a target layer, at least a neighboring layout included in a design layout for a lower layer of the target layer may be loaded.

The example embodiments described with reference to FIGS. 2 to 21 may be implemented according to the operations of the processor 2100 and the memory/storage 2200. The mask fabricating device 2000 may be used to fabricate the mask 1400 according to the operations of the processor 2100 and the memory/storage 2200.

The mask fabricating device 2000 may execute software including computer instructions according to the operations of the processor 2100 and the memory/storage 2200. For example, the software may include an operating system (OS) and/or an application program. The OS may provide at least one service to the application program, and may operate as an arbitrator between the application program and components of the mask fabricating device 2000. For example, the application program may include a design program that is used to design a layout according to the example embodiments described with reference to FIGS. 2 to 21.

The design program may be executed to process some operation(s) associated with optical proximity correction. For example, the design program may process the operation(s) associated with the optical proximity correction on the processor 2100, by means of the data of the design layout loaded from the memory/storage 2200. In the example embodiments, optical proximity correction for the target layer may be performed considering a margin between the neighboring layout and the layout of the target layer. For brevity, redundant descriptions of the example embodiments will be omitted below.

The user interface 2300 may be used to provide a user 10 with a result obtained by the operations of the processor 2100 and the memory/storage 2200. In addition, the user interface 2300 may be used to receive various data (e.g., data associated with a layout design, etc.) from the user 10. In some example embodiments, before the optical proximity correction is performed, the mask fabricating device 2000 may receive the values of the margins MA, MA1, and MA2 of FIGS. 14 and 21 and/or the set values of the Equation (2) through the user interface 2300.

For example, the user 10 may be a designer of the mask 1400 and/or a layout. For example, the user interface 2300 may include one or more input/output (I/O) interfaces, such as a display device, a speaker, a keyboard, a mouse, etc.

The mask fabricating 2000 may output a design layout FU that is finally updated according to the example embodiments described with reference to FIGS. 2 to 21. The finally updated design layout FU may be obtained by performing optical proximity correction until an error between an actual layout and a target layout becomes within an acceptable level or threshold. In the example embodiments, the finally updated design layout FU may be obtained by performing optical proximity correction until an interest segment is biased up to an allowable boundary defined by a margin.

The mask fabricating device 2000 may fabricate the mask 1400 based on the finally updated design layout FU. The mask 1400 may be fabricated to include image patterns corresponding to the finally updated design layout FU.

Figure 23:
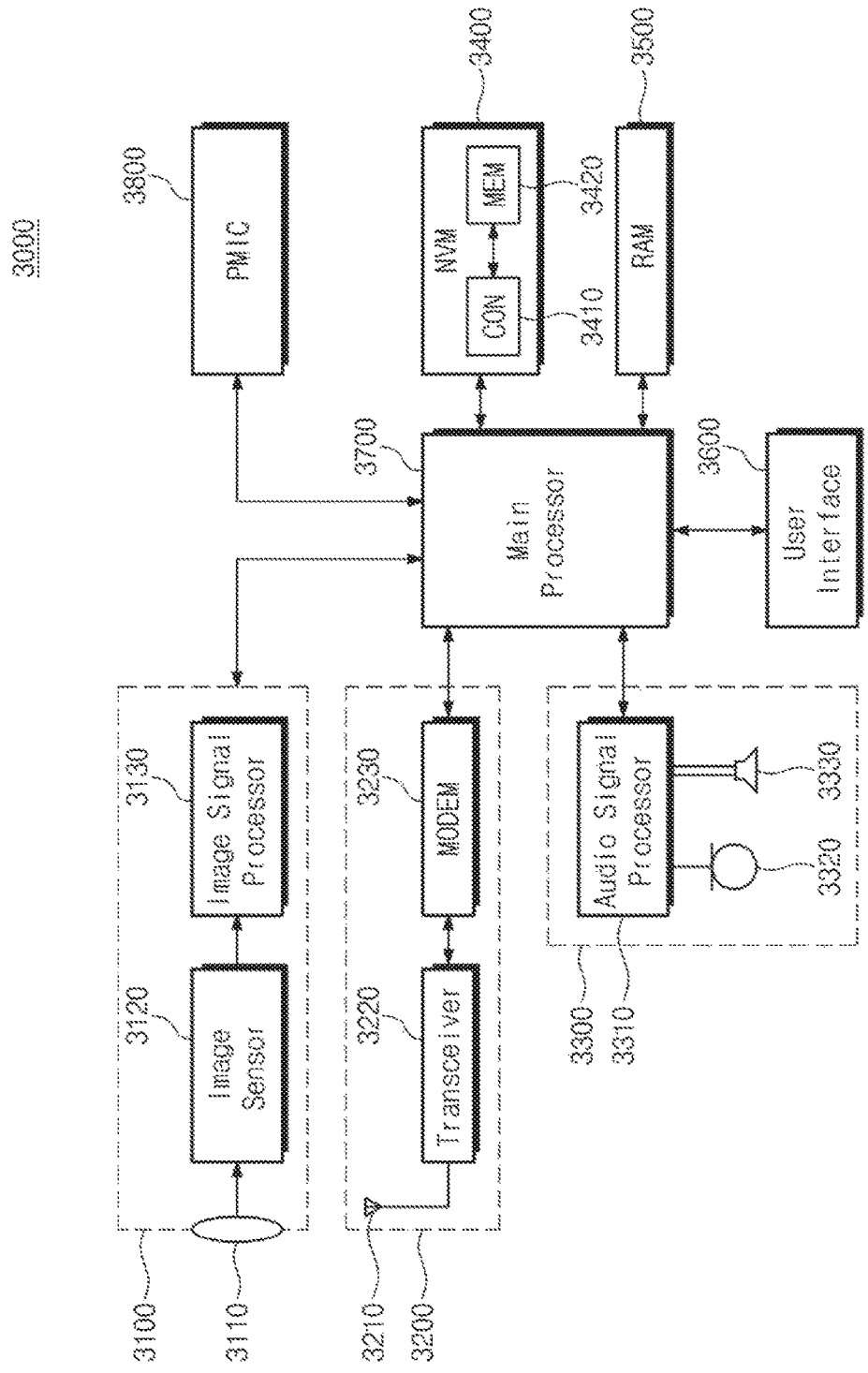
FIG. 23 is a block diagram illustrating a mobile electronic device that includes a chip and/or a circuit implemented using a mask fabricated according to the example embodiments.

FIG. 23 is a block diagram illustrating a mobile electronic device 3000 that includes a chip and/or a circuit formed using a mask fabricated according to the example embodiments. The mobile electronic device 3000 may include an image processor 3100, a wireless communication block 3200, an audio processor 3300, a nonvolatile memory 3400, a RAM 3500, a user interface 3600, a main processor 3700, and a power management integrated circuit 3800. In some example embodiments, the mobile electronic device 3000 may be one of various electronic devices, such as a mobile terminal, a portable digital assistant (PDA), a personal multimedia player (PMP), a digital camera, a smart phone, a notebook computer, a table computer, a wearable device, and/or the like.

The image processor 3100 may receive light from a lens 3110. An image sensor 3120 and an image signal processor 3130 included in the image processor 3100 may generate an image based on the received light.

The wireless communication block 3200 may include an antenna 3210, a transceiver 3220, and a modulator/demodulator (MODEM) 3230. The wireless communication block 3200 may communicate with an external entity of the mobile electronic device 3000 in compliance with various wireless communication protocols, such as global system for mobile communication (GSM), code division multiple access (CDMA), wideband CDMA (WCDMA), high speed packet access (HSPA), evolution-data optimized (EV-DO), worldwide interoperability for microwave access (WiMax), wireless broadband (WiBro), long term evolution (LTE), Bluetooth, near field communication (NFC), wireless fidelity (WiFi), radio frequency identification (RFID), and/or the like.

The audio processor 3300 may process an audio signal using the audio signal processor 3310. The audio processor 3300 may receive an audio input through a microphone 3320 and/or may provide an audio output through a speaker 3330.

The nonvolatile memory 3400 may store data that is required to be retained irrespective of whether power is supplied. For example, the nonvolatile memory 3400 may include at least one of a flash memory, a PRAM, an MRAM, a ReRAM, an FRAM, and/or any combination thereof. The memory device 3420 may store or output data according to the control of a memory controller 3410.

The RAM 3500 may store data used to operate the mobile electronic device 3000. For example, the RAM 3500 may be used as a working memory, an operation memory, a buffer memory, and/or the like, of the mobile electronic device 3000. The RAM 3500 may temporarily store data processed or to be processed by the main processor 3700.

The user interface 3600 may process interfacing between a user and the mobile electronic device 3000 according to the control of the main processor 3700. For example, the user interface 3600 may include an input interface, such as a keyboard, a keypad, a button, a touch panel, a touch screen, a touch ball, a touch pad, a camera, a microphone, a gyroscope sensor, a vibration sensor, and/or the like. The user interface device 3600 may include an output interface, such as a display device, a motor, and/or the like. For example, the display device may include a liquid crystal display (LCD), a light emitting diode (LED) display, an organic LED (OLED) display, an active matrix OLED (AMOLED) display, and/or the like.

The main processor 3700 may control the overall operations of the mobile electronic device 3000. The image processor 3100, the wireless communication block 3200, the audio processor 3300, the nonvolatile memory 3400, and the RAM 3500 may execute a user command provided via the user interface 3600 according to the control of the main processor 3700. In addition, the image processor 3100, the wireless communication block 3200, the audio processor 3300, the nonvolatile memory 3400, and the RAM 3500 may provide a service to the user via the user interface 3600 according to the control of the main processor 3700. The main processor 3700 may be implemented with a system-on-chip (SoC). For example, the main processor 3700 may include an application processor.

The power management integrated circuit 3800 may manage power used to operate the mobile electronic device 3000. For example, the power management integrated circuit 3800 may convert power supplied from a battery (not shown) or an external power source (not shown) into any suitable form or level. In addition, the power management integrated circuit 3800 may supply the suitably converted power to components of the mobile electronic device 3000.

Each of the image processor 3100, the wireless communication block 3200, the audio processor 3300, the nonvolatile memory 3400, the RAM 3500, the user interface 3600, the main processor 3700, and the power management integrated circuit 3800 may include a circuit and/or a chip implemented using a mask fabricated according to the example embodiments described with reference to FIGS. 2 to 21. A circuit and/or a chip included in each of the image processor 3100, the wireless communication block 3200, the audio processor 3300, the NVM 3400, the RAM 3500, the user interface 3600, the main processor 3700, and the PMIC 3800 may be implemented using a mask fabricated by optical proximity correction according to the example embodiments.

As described above, optical proximity according to the example embodiments may be performed taking into consideration a plurality of layers. In the example embodiments, optical proximity correction for a target layer may be performed considering a margin between a neighboring layout and a layout of the target layout. When the mask fabricated according to the example embodiments is used, a minimum allowable margin may be ensured between layouts associated with the plurality of layers that is disposed at different positions. Moreover, a layout for a via connecting the layers may have a sufficient area. Thus, an optimal margin may be obtained between the layouts associated with the plurality of layers that is disposed at different positions.

A circuit implemented using a mask according to example embodiments may be mounted in various types of semiconductor packages. For example, a circuit implemented using a mask according to example embodiments may be packaged by one or more of package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), wafer-level processed stack package (WSP), and/or the like.

A device configuration shown in each block diagram is provided to help better understanding of the present disclosure. Each block may be formed of smaller blocks according to functions. Alternatively, a plurality of blocks may form a larger block according to a function. That is, the spirit or the scope of the present disclosure is not limited to the configuration shown in a block diagram.

The present disclosure has been described based on some example embodiments. It should be understood that the above example embodiments are in descriptive and illustrative views, rather than restrictive views. That is, the spirit or the scope that includes the subject matters of the present disclosure and that may achieve a goal of the present disclosure should be included within the spirit and scope of the present disclosure.

Accordingly, a modified or altered technical concept without departing from the scope or the spirit of the present disclosure is included in the scope of the claims below. The scope of the present disclosure is not limited to the above example embodiments.

What is claimed is:

1. A method for fabricating a mask, the method comprising:
dividing an outline of a first design layout into a plurality of segments, the first design layout being associated with a target layer of optical proximity correction;
selecting one or more first segments from among the plurality of segments, the one or more first segments being biased in a direction relative to an outline of a second design layout, the second layout being associated with a lower layer that is below the target layer;
performing the optical proximity correction for the target layer based on a first cost function and a second cost function, the first cost function being applied to one or more second segments among the plurality of segments, the second cost function being applied to the one or more first segments;
updating the first design layout based on a result of the optical proximity correction; and
fabricating the mask corresponding to the updated first design layout,
wherein the second cost function includes a model associated with a corresponding margin between each of the one or more first segments and the outline of the second design layout, and
wherein performing the optical proximity correction comprises biasing each of the one or more first segments up to a corresponding boundary defined by the corresponding margin.

2. The method as set forth in claim 1, wherein the lower layer corresponds to a metal layer, and
wherein the target layer corresponds to a via layer connecting the lower layer with an upper layer that is to be provided on the lower layer.

3. The method as set forth in claim 1, wherein the first cost function includes a model to minimize an error between a target layout and an actual layout that is to be actually printed based on the one or more second segments.

4. The method as set forth in claim 1, wherein the performing the optical proximity correction further comprises:
performing the optical proximity correction such that the model of the second cost function converges into a set value for each of the one or more first segments corresponding to the corresponding margin.

5. The method as set forth in claim 4, further comprising:
receiving, via a user interface, the set value for each of the one or more first segments before the optical proximity correction is performed.

6. The method as set forth in claim 1, wherein the second design layout does not overlap the first design layout, and the second design layout is within a reference distance from the outline of the first design layout.

7. The method as set forth in claim 1, wherein a value of the corresponding margin associated with each of the one or more first segments is set to be different for the respective first segments.

8. The method as set forth in claim 7, further comprising:
assigning an identification marker to each of the one or more first segments,
wherein the value of the corresponding margin associated with each of the one or more first segments is recognized based on the assigned identification marker.

9. The method as set forth in claim 1, wherein the performing the optical proximity correction is repeated when any of the one or more first segments is not biased up to the corresponding boundary.

10. A method for fabricating a mask, the method comprising:
performing first optical proximity correction for a first metal layer;
performing second optical proximity correction for a second metal layer provided on the first metal layer;
performing third optical proximity correction for a via layer that connects the first metal layer with the second metal layer, the third optical proximity correction including:
obtaining a neighboring layout from a first design layout associated with the first metal layer, wherein the neighboring layout does not overlap a second design layout associated with the via layer and is within a reference distance from an outline of the second design layout,
selecting one or more first segments from among a plurality of segments that are defined by dividing the outline of the second design layout, the one or more first segments being segments to be biased in a direction of an outline of the neighboring layout, and
performing the third optical proximity correction based on a first cost function applied to each of one or more second segments among the plurality of segments and a second cost function applied to each of the one or more first segments, wherein the second cost function includes a model associated with a corresponding margin between each of the one or more first segments and the outline of the neighboring layout; and
fabricating the mask based on results of the first optical proximity correction, the second optical proximity correction, and the third optical proximity correction.

11. The method as set forth in claim 10, wherein a third cost function is applied to each of segments that are generated by dividing an outline of the first design layout during the performing the first optical proximity correction for the first metal layer, and
wherein the third cost function is different from the second cost function.

12. The method as set forth in claim 11, wherein the third cost function includes a model to minimize an error between a target layout and an actual layout that is to be actually printed based on the first design layout.

13. The method as set forth in claim 10, wherein the performing the third optical proximity correction based on the first cost function and the second cost function comprises:
adjusting an outline of a target layout to correspond to a corresponding boundary defined by the corresponding margin, wherein the one or more first segments are biased in the target layout by the third optical proximity correction.

14. The method as set forth in claim 13, wherein the performing the third optical proximity correction based on the first cost function and the second cost function comprises:
biasing each of the one or more first segments to the corresponding boundary.

15. The method as set forth in claim 13, wherein the performing the third optical proximity correction based on the first cost function and the second cost function is repeated until each of the one or more first segments is biased up to the corresponding boundary.

16. A method for fabricating a mask, the method comprising:
defining a plurality of segments of an outline of a first design layout, wherein the first design layout is associated with a target layer of optical proximity correction;
selecting, from among the plurality of segments, one or more first segments for biasing in a direction relative to an outline of a second design layout;
performing the optical proximity correction for the target layer based on a first cost function applied to one or more second segments among the plurality of segments and a second cost function applied to the one or more first segments by biasing each of the one or more first segments up to a corresponding boundary defined by a corresponding margin between each of the one or more first segments and the outline of the second design layout, wherein the second cost function includes a model associated with the corresponding margin;

updating the first design layout based on a result of the optical proximity correction; and fabricating the mask corresponding to the updated first design layout.

17. The method as set forth in claim 16, wherein the second design layout is associated with a lower layer that corresponds to a metal layer, and wherein the target layer corresponds to a via layer connecting the lower layer with an upper layer that is to be provided on the lower layer.

18. The method as set forth in claim 16, wherein the first cost function includes a model to minimize an error between a target layout and an actual layout that is to be actually printed based on the one or more second segments.

19. The method as set forth in claim 16, wherein the performing the optical proximity correction further comprises:

performing the optical proximity correction such that the model of the second cost function converges into a set value for each of the one or more first segments associated with the corresponding margin.

20. The method as set forth in claim 16, further including:

determining that at least one of the one or more first segments is not biased up to the corresponding boundary; and performing the optical proximity correction.

\* \* \* \* \*